United States Patent
Nhan et al.

(10) Patent No.: US 11,764,911 B2
(45) Date of Patent: Sep. 19, 2023

(54) METHOD OF SHIFTING REDUNDANCY VERSION FOR THE TRANSMISSION OF A TRANSPORT BLOCK OVER MULTIPLE SLOTS

(71) Applicant: Nokia Technologies Oy, Espoo (FI)

(72) Inventors: Nhat-Quang Nhan, Reims (FR); Marco Maso, Issy les Moulineaux (FR); Pasi Eino Tapio Kinnunen, Oulu (FI); Karri Markus Ranta-aho, Espoo (FI); Alessio Marcone, Munich (DE)

(73) Assignee: NOKIA TECHNOLOGIES OY, Espoo (FI)

( * ) Notice: Subject to any disclaimer, the term of this patent is extended or adjusted under 35 U.S.C. 154(b) by 0 days.

(21) Appl. No.: 17/221,954

(22) Filed: Apr. 5, 2021

(65) Prior Publication Data
US 2022/0321269 A1 Oct. 6, 2022

(51) Int. Cl.
*H04L 1/18* (2006.01)
*H04L 1/00* (2006.01)
*H04L 1/1867* (2023.01)

(52) U.S. Cl.
CPC .......... *H04L 1/189* (2013.01); *H04L 1/0068* (2013.01); *H04L 1/1874* (2013.01)

(58) Field of Classification Search
CPC ...... H04L 1/189; H04L 1/0068; H04L 1/1874
See application file for complete search history.

(56) References Cited

U.S. PATENT DOCUMENTS

| | | | |
|---|---|---|---|
| 6,578,105 B2 * | 6/2003 | Finn | G06F 5/14 |
| | | | 714/719 |
| 9,461,775 B2 * | 10/2016 | Chen | H04L 27/362 |
| 10,348,329 B2 * | 7/2019 | Soriaga | H04L 1/1819 |
| 11,271,678 B2 * | 3/2022 | Coffey | H03M 13/1102 |
| 11,394,504 B2 * | 7/2022 | Sun | H04L 1/08 |
| 2009/0086849 A1 * | 4/2009 | Tsai | H04L 1/0067 |
| | | | 375/295 |

(Continued)

OTHER PUBLICATIONS

"3rd Generation Partnership Project; Technical Specification Group Radio Access Network; NR; Multiplexing and Channel Coding (Release 15)", 3GPP Draft, R1-1803544 38212 Mar. 9, 2018 1300, (Mar. 2018), 95 pages.

(Continued)

*Primary Examiner* — Redentor Pasia
(74) *Attorney, Agent, or Firm* — ALSTON & BIRD LLP

(57) ABSTRACT

Where large transport blocks are rate-matched and transmitted on each PUSCH segment using different redundancy versions (RVs), RV cycling with a small number of PUSCH segments might not cover the whole codeword, and/or rate-matching a large TBS across many PUSCH segments into the resource of a single PUSCH segment may lead to an effective coding rate of the self-decodable redundancy versions that is too high. To avoid these issues, the starting position of one or more RVs may be shifted by setting the starting position of a current RV to be the same as an ending position of a previous position, or by scaling the starting position by a value. Alternatively, these issues may be avoided by setting a new starting position for an RV based on the gap from the end of a previous RV to the start of a current RV.

15 Claims, 10 Drawing Sheets

(56) References Cited

U.S. PATENT DOCUMENTS

| | | | | |
|---|---|---|---|---|
| 2010/0303016 | A1* | 12/2010 | Jin | H04L 27/0008 |
| | | | | 370/328 |
| 2014/0351366 | A1* | 11/2014 | Maeda | H04L 65/70 |
| | | | | 709/215 |
| 2016/0308644 | A1* | 10/2016 | Shen | H04L 1/0057 |
| 2017/0005753 | A1* | 1/2017 | Shen | H04L 1/1812 |
| 2017/0012739 | A1* | 1/2017 | Shen | H03M 13/2757 |
| 2018/0143939 | A1* | 5/2018 | Fu | G06F 3/0604 |
| 2019/0097767 | A1* | 3/2019 | Qin | H04L 1/0014 |
| 2019/0356333 | A1* | 11/2019 | Ma | H03M 13/116 |
| 2020/0304235 | A1* | 9/2020 | Li | H04L 1/1874 |
| 2021/0320753 | A1* | 10/2021 | Shimezawa | H04L 1/0057 |

OTHER PUBLICATIONS

"3rd Generation Partnership Project; Technical Specification Group Radio Access Network; NR; Multiplexing and channel coding (Release 16)", 3GPP TS 38.212 v16.4.0, (Dec. 2020), 152 pages.

Broadcom, "LBRM Procedure with a Simplified RV Definition on Exact Soft Buffer", 3GPP TSG-RAN Working Group 1 #52, R1-081043, (Jan. 11-15, 2008), 7 pages.

International Search Report and Written Opinion for Patent Cooperation Treaty Application No. PCT/EP2022/058749 dated Oct. 5, 2022, 19 pages.

Qualcomm Inc., "TB Processing over Multi-Slot PUSCH", 3GPP TSG-RAN WG1 Meeting #104e, R1-2101478, (Jan. 25-Feb. 5, 2021), 3 pages.

* cited by examiner

900

Scaling a predetermined starting position of at least one redundancy version of encoded bits of a transport block in a circular buffer based, at least partially, on a scaling factor — 910

Transmit at least the at least one redundancy version using the scaled starting position of the at least one redundancy version of the transport block — 920

FIG. 9

1000 — Determine whether a user equipment should use a first method to determine a starting position of at least one redundancy version of a transport block in a circular buffer or a second method to determine the starting position of the at least one redundancy version of the transport block in the circular buffer, wherein the second method comprises determining the starting position of the at least one redundancy version based, at least partially, on one of:

a position of another redundancy version of the transport block in the circular buffer, or a scaling factor

1010

1020 — Transmit an indication to determine the starting position of the at least one redundancy version based on at least one of the first method or the second method

FIG. 10

METHOD OF SHIFTING REDUNDANCY VERSION FOR THE TRANSMISSION OF A TRANSPORT BLOCK OVER MULTIPLE SLOTS

BACKGROUND

Technical Field

The example and non-limiting embodiments relate generally to NR coverage enhancements, and more specifically to rate matching and the transmission of a transport block over multiple slots (TBoMS).

Brief Description of Prior Developments

It is known, for transport block transmission, to perform redundancy version cycling across PUSCH segments for TBoMS where a PUSCH segment is within a slot.

BRIEF DESCRIPTION OF THE DRAWINGS

The foregoing aspects and other features are explained in the following description, taken in connection with the accompanying drawings, wherein:

FIG. 9 is a flowchart illustrating steps as described herein; and

FIG. 10 is a flowchart illustrating steps as described herein.

DETAILED DESCRIPTION OF EMBODIMENTS

Figure 1:
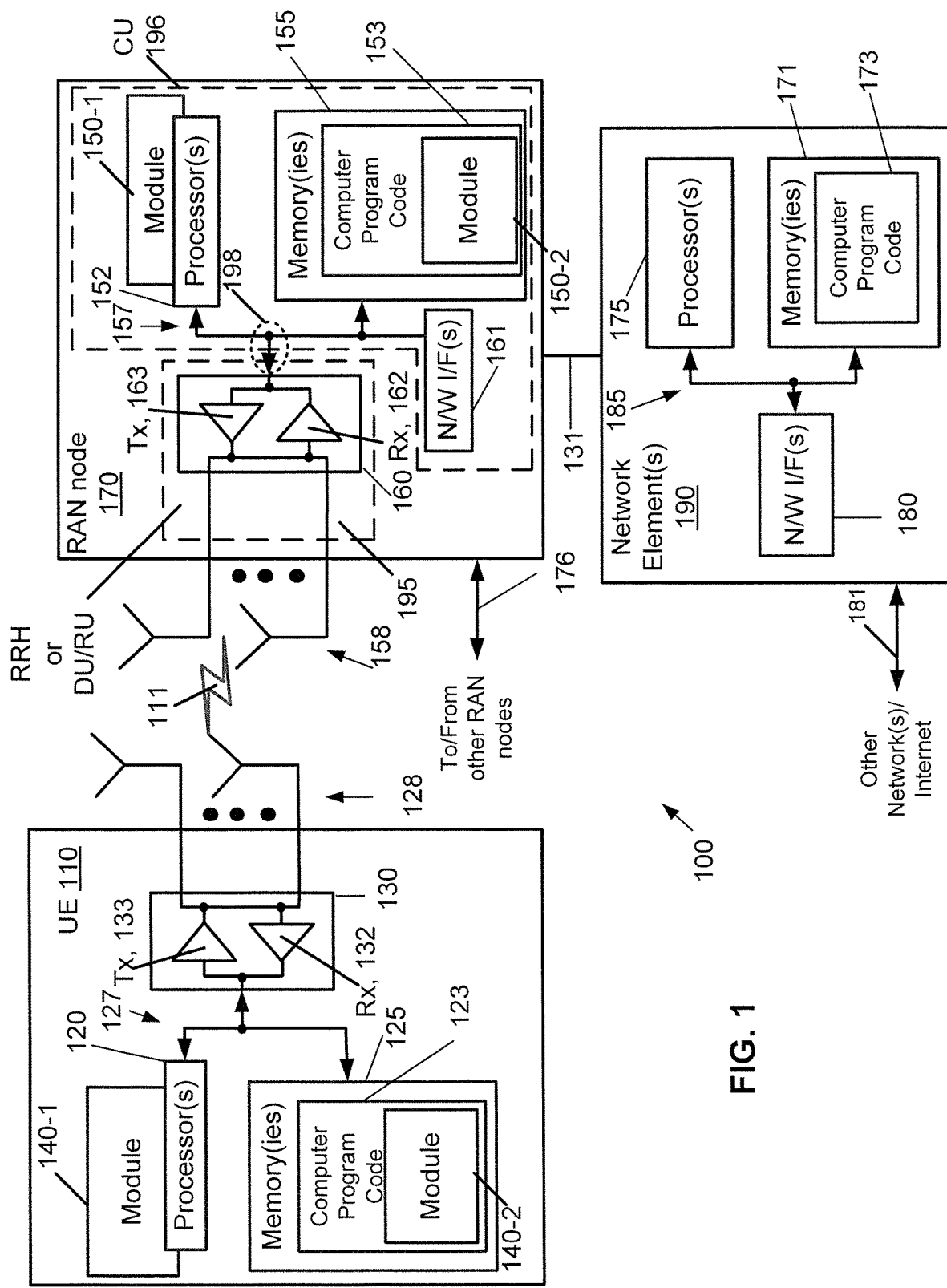
FIG. 1 is a block diagram of one possible and non-limiting exemplary system in which the exemplary embodiments may be practiced.

The following abbreviations that may be found in the specification and/or the drawing figures are defined as follows:

3GPP third generation partnership project
5G fifth generation
5GC 5G core network
AMF access and mobility management function
CRC cyclic redundancy check
CQI channel quality indicator
CU central unit
DCI downlink control information
DMRS demodulation reference signal
DU distributed unit
eNB (or eNodeB) evolved Node B (e.g., an LTE base station)
EN-DC E-UTRA-NR dual connectivity
en-gNB or En-gNB node providing NR user plane and control plane protocol terminations towards the UE, and acting as secondary node in EN-DC
E-UTRA evolved universal terrestrial radio access, i.e., the LTE radio access technology
FDD frequency division duplex
gNB (or gNodeB) base station for 5G/NR, i.e., a node providing NR user plane and control plane protocol terminations towards the UE, and connected via the NG interface to the 5GC
I/F interface
L1 layer 1
LDPC low-density parity check
LTE long term evolution
MAC medium access control
MCS modulation and coding scheme
MIMO multiple in multiple out
MME mobility management entity
ng or NG new generation
ng-eNB or NG-eNB new generation eNB
NR new radio
N/W or NW network
PDCP packet data convergence protocol
PHY physical layer
PRB physical resource block
PUCCH physical uplink control channel
PUSCH physical uplink shared channel
QPSK quadrature phase shift keying
RAN radio access network
RE resource element
RF radio frequency
RLC radio link control
RRH remote radio head
RRC radio resource control
RS reference signal
RU radio unit
RV redundancy version
Rx receiver
SDAP service data adaptation protocol
SGW serving gateway
SLIV start and length indicator
SMF session management function
SUL supplementary uplink
TB transport block
TBoMS transport block over multiple slots
TBS transport block size
TDD time division duplex
TDRA time-domain resource allocation
Tx transmitter
UE user equipment (e.g., a wireless, typically mobile device)
UL uplink
UPF user plane function Turning to FIG. 1, this figure shows a block diagram of one possible and non-limiting example in which the examples may be practiced. A user equipment (UE) 110, radio access network (RAN) node 170, and network element(s) 190 are illustrated. In the example of FIG. 1, the user equipment (UE) 110 is in wireless communication with a wireless network 100. A UE is a wireless device that can access the wireless network 100. The UE 110 includes one or more processors 120, one or more memories 125, and one or more transceivers 130 interconnected through one or more buses 127. Each of the one or more transceivers 130 includes a receiver, Rx, 132 and a transmitter, Tx, 133. The one or more buses 127 may be address, data, or control buses, and may include any interconnection mechanism, such as a series of lines on a motherboard or integrated circuit, fiber optics or other optical communication equipment, and the like. The one or more transceivers 130 are connected to one or more antennas 128. The one or more memories 125 include computer program code 123. The UE 110 includes a module 140, comprising one of or both parts 140-1 and/or 140-2, which may be implemented in a number of ways. The module 140 may be implemented in hardware as module 140-1, such as being implemented as part of the one or more processors 120. The module 140-1 may be implemented also as an integrated circuit or through other hardware such as a programmable gate array. In another example, the module 140 may be implemented as module 140-2, which is implemented as computer program code 123 and is executed by the one or more processors 120. For instance, the one or more memories 125 and the computer program code 123 may be configured to, with the one or more processors 120, cause the user equipment 110 to perform one or more of the operations as described herein. The UE 110 communicates with RAN node 170 via a wireless link 111.

The RAN node 170 in this example is a base station that provides access by wireless devices such as the UE 110 to the wireless network 100. The RAN node 170 may be, for example, a base station for 5G, also called New Radio (NR). In 5G, the RAN node 170 may be a NG-RAN node, which is defined as either a gNB or a ng-eNB. A gNB is a node providing NR user plane and control plane protocol terminations towards the UE, and connected via the NG interface to a 5GC (such as, for example, the network element(s) 190). The ng-eNB is a node providing E-UTRA user plane and control plane protocol terminations towards the UE, and connected via the NG interface to the 5GC. The NG-RAN node may include multiple gNBs, which may also include a central unit (CU) (gNB-CU) 196 and distributed unit(s) (DUs) (gNB-DUs), of which DU 195 is shown. Note that the DU may include or be coupled to and control a radio unit (RU). The gNB-CU is a logical node hosting RRC, SDAP and PDCP protocols of the gNB or RRC and PDCP protocols of the en-gNB that controls the operation of one or more gNB-DUs. The gNB-CU terminates the F1 interface connected with the gNB-DU. The F1 interface is illustrated as reference 198, although reference 198 also illustrates a link between remote elements of the RAN node 170 and centralized elements of the RAN node 170, such as between the gNB-CU 196 and the gNB-DU 195. The gNB-DU is a logical node hosting RLC, MAC and PHY layers of the gNB or en-gNB, and its operation is partly controlled by gNB-CU. One gNB-CU supports one or multiple cells. One cell is supported by only one gNB-DU. The gNB-DU terminates the F1 interface 198 connected with the gNB-CU. Note that the DU 195 is considered to include the transceiver 160, e.g., as part of a RU, but some examples of this may have the transceiver 160 as part of a separate RU, e.g., under control of and connected to the DU 195. The RAN node 170 may also be an eNB (evolved NodeB) base station, for LTE (long term evolution), or any other suitable base station or node.

The RAN node 170 includes one or more processors 152, one or more memories 155, one or more network interfaces (N/W I/F(s)) 161, and one or more transceivers 160 interconnected through one or more buses 157. Each of the one or more transceivers 160 includes a receiver, Rx, 162 and a transmitter, Tx, 163. The one or more transceivers 160 are connected to one or more antennas 158. The one or more memories 155 include computer program code 153. The CU 196 may include the processor(s) 152, memories 155, and network interfaces 161. Note that the DU 195 may also contain its own memory/memories and processor(s), and/or other hardware, but these are not shown.

The RAN node 170 includes a module 150, comprising one of or both parts 150-1 and/or 150-2, which may be implemented in a number of ways. The module 150 may be implemented in hardware as module 150-1, such as being implemented as part of the one or more processors 152. The module 150-1 may be implemented also as an integrated circuit or through other hardware such as a programmable gate array. In another example, the module 150 may be implemented as module 150-2, which is implemented as computer program code 153 and is executed by the one or more processors 152. For instance, the one or more memories 155 and the computer program code 153 are configured to, with the one or more processors 152, cause the RAN node 170 to perform one or more of the operations as described herein. Note that the functionality of the module 150 may be distributed, such as being distributed between the DU 195 and the CU 196, or be implemented solely in the DU 195.

The one or more network interfaces 161 communicate over a network such as via the links 176 and 131. Two or more gNBs 170 may communicate using, e.g., link 176. The link 176 may be wired or wireless or both and may implement, for example, an Xn interface for 5G, an X2 interface for LTE, or other suitable interface for other standards.

The one or more buses 157 may be address, data, or control buses, and may include any interconnection mechanism, such as a series of lines on a motherboard or integrated circuit, fiber optics or other optical communication equipment, wireless channels, and the like. For example, the one or more transceivers 160 may be implemented as a remote radio head (RRH) 195 for LTE or a distributed unit (DU) 195 for gNB implementation for 5G, with the other elements of the RAN node 170 possibly being physically in a different location from the RRH/DU, and the one or more buses 157 could be implemented in part as, for example, fiber optic cable or other suitable network connection to connect the other elements (e.g., a central unit (CU), gNB-CU) of the RAN node 170 to the RRH/DU 195. Reference 198 also indicates those suitable network link(s).

It is noted that description herein indicates that "cells" perform functions, but it should be clear that equipment which forms the cell will perform the functions. The cell makes up part of a base station. That is, there can be multiple cells per base station. For example, there could be three cells for a single carrier frequency and associated bandwidth, each cell covering one-third of a 360 degree area so that the single base station's coverage area covers an approximate oval or circle. Furthermore, each cell can correspond to a single carrier and a base station may use multiple carriers. So if there are three 120 degree cells per carrier and two carriers, then the base station has a total of 6 cells.

The wireless network 100 may include a network element or elements 190 that may include core network functionality, and which provides connectivity via a link or links 181 with a further network, such as a telephone network and/or a data communications network (e.g., the Internet). Such core network functionality for 5G may include access and mobility management function(s) (AMF(s)) and/or user plane functions (UPF(s)) and/or session management function(s) (SMF(s)). Such core network functionality for LTE may include MME (Mobility Management Entity)/SGW (Serving Gateway) functionality. These are merely exemplary functions that may be supported by the network element(s) 190, and note that both 5G and LTE functions might be supported. The RAN node 170 is coupled via a link 131 to a network element 190. The link 131 may be implemented as, e.g., an NG interface for 5G, or an S1 interface for LTE, or other suitable interface for other standards. The network element 190 includes one or more processors 175, one or more memories 171, and one or more network interfaces (N/W I/F(s)) 180, interconnected through one or more buses 185. The one or more memories 171 include computer program code 173. The one or more memories 171 and the computer program code 173 are configured to, with the one or more processors 175, cause the network element 190 to perform one or more operations.

The wireless network 100 may implement network virtualization, which is the process of combining hardware and software network resources and network functionality into a single, software-based administrative entity, a virtual network. Network virtualization involves platform virtualization, often combined with resource virtualization. Network virtualization is categorized as either external, combining many networks, or parts of networks, into a virtual unit, or internal, providing network-like functionality to software containers on a single system. Note that the virtualized entities that result from the network virtualization are still implemented, at some level, using hardware such as processors 152 or 175 and memories 155 and 171, and also such virtualized entities create technical effects.

The computer readable memories 125, 155, and 171 may be of any type suitable to the local technical environment and may be implemented using any suitable data storage technology, such as semiconductor based memory devices, flash memory, magnetic memory devices and systems, optical memory devices and systems, fixed memory and removable memory. The computer readable memories 125, 155, and 171 may be means for performing storage functions. The processors 120, 152, and 175 may be of any type suitable to the local technical environment, and may include one or more of general purpose computers, special purpose computers, microprocessors, digital signal processors (DSPs) and processors based on a multi-core processor architecture, as non-limiting examples. The processors 120, 152, and 175 may be means for performing functions, such as controlling the UE 110, RAN node 170, and other functions as described herein.

In general, the various embodiments of the user equipment 110 can include, but are not limited to, cellular telephones such as smart phones, tablets, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, tablets with wireless communication capabilities, as well as portable units or terminals that incorporate combinations of such functions.

Features as described herein generally relate to enhancements for physical uplink shared channel (PUSCH). These enhancements may apply to FR1, FR2, time division duplex (TDD), and/or frequency division duplex (FDD) transmission(s). Features as described herein may relate to mechanism(s) to support transport block (TB) processing over multi-slot PUSCH (TBoMS). In example embodiments of the present disclosure, transport block size (TBS) may be determined based on multiple slots and may be transmitted over multiple slots.

Features as described herein generally relate to rate matching and the transmission of a transport block over multiple slots (TBoMS). The total number of allocated symbols for TBoMS PUSCH may be grouped into multiple PUSCH segments. Each PUSCH segment may contain contiguous PUSCH symbols and may cross the slot boundary. Example embodiments of the present disclosure may relate to setting/defining and/or indicating new starting position(s) of one or multiple redundancy versions (RVs) in the circular buffer that is used for rate matching to store the different RVs of the data to be transmitted. The new starting positions may be based on the ending position of previous RV in the circular buffer, or may be scaled down/up (shifted) from the current positions of RV in the circular buffer, or may be based on the gap from the end of the previous RV in the circular buffer (e.g. a scalar).

Transport block size (TBS) may be determined based on the scheduled modulation order $Q_m$, coding rate R, number of multiple in multiple out (MIMO) layers v, and number of available resource elements (REs) in the scheduled slot. To deliver a packet to a base station (e.g. gNB), a UE may be scheduled with a higher modulation and coding scheme (MCS) and fewer resources if the channel condition is good (e.g. high channel quality indicator (CQI)), or a lower MCS and more resources if the channel condition is bad (e.g. low CQI). For a UE at cell-edge, a larger resource allocation might not be ideal due to the limited power budget. Thus, cell-edge UEs are more likely to engage in narrow band transmissions with low MCS (e.g. quadrature phase shift keying (QPSK) and lower coding rate). Such a configuration might often require the UE to divide a higher-layer packet into multiple segments and transmit the packets over multiple small TBs in multiple UL grants.

The number of allocated physical resource blocks (PRB) may be the same across PUSCH segments. A large transport block size (TBS) for TBoMS may be determined based on all or part of the resource elements across the allocated PUSCH segments. Consecutive or non-consecutive slots may be used to this end. The TB may or may not be rate-matched and transmitted on each PUSCH segment using different redundancy versions (RVs).

If TB is rate-matched and transmitted on each segment, RVs are cycled across the allocated PUSCH segments. This may entail at least two important drawbacks. First, currently the starting positions of RVs in the circular buffer are fixed and depend on the circular buffer size. Therefore, RV cycling with a small number of PUSCH segments (and hence a small number of RVs) may not cover the whole codeword (see description of FIGS. 3 and 4 below). Second, rate-matching a large TBS across many PUSCH segments into the resource of a single PUSCH segment may lead to an effective coding rate of the self-decodable redundancy versions that is too high (see description of FIG. 5 below).

The total number of allocated symbols for TBoMS PUSCH may be grouped into multiple PUSCH segments. Each PUSCH segment may contain contiguous PUSCH symbols, and may or may not cross the slot boundary. The number of allocated PRBs may be the same across PUSCH segments.

Figure 2:
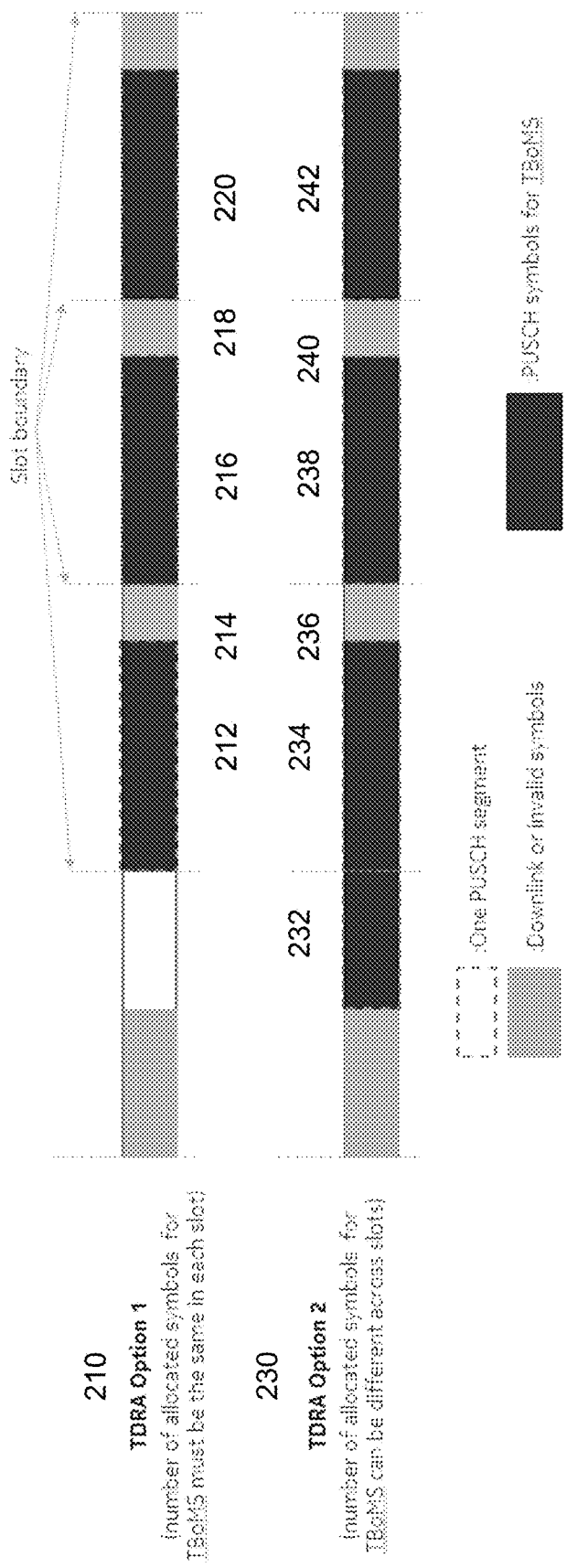
FIG. 2 is a diagram illustrating features as described herein.

There may be two options for the time-domain resource allocation (TDRA) of TBoMS. In Option 1, the number of allocated symbols for TBoMS is the same in each slot. In Option 2, the number of allocated symbols for TBoMS may or may not be the same across slots. Referring now to FIG. 2, illustrated are the two possible options for TDRA for TBoMS.

210 illustrates an example of TDRA Option 1, in which the number of allocated symbols for TBOMS is the same in each slot. After a slot boundary, at 212, 216, and 220, PUSCH symbols for TBoMS are transmitted during one PUSCH segment that does not cross a slot boundary. At 214 and 218, downlink or invalid symbols are transmitted.

230 illustrates an example of TDRA Option 2, in which the number of allocated symbols for TBoMS may be different across slots. PUSCH symbols for TBoMS are transmitted during one PUSCH segment, which is bisected by a slot boundary into 232 and 234. In contrast, after a slot boundary, at 238 and 242, PUSCH symbols for TBoMS are transmitted during one PUSCH segment. The number of allocated symbols for TBoMS is different and larger at the PUSCH segment of 232 and 234 than the PUSCH segment at 238 or the PUSCH segment at 242. At 236 and 240, downlink or invalid symbols are transmitted.

A (large) TB for TBoMS may be determined based on all or part of the resource elements across the allocated PUSCH segments. A possible issue with mapping of a large TB on an allocated resource may be that non-consecutive physical slots might not be used for TBoMS, unless the large TB is rate-matched and transmitted on each PUSCH segment using different redundancy versions (i.e., RV cycling).

In R1-2101478, the idea of rate-matching and transmitting a large TB on different slots with different redundancy versions was proposed. If a Rel-15/16 PUSCH repetition type A framework is considered for realizing the TBoMS, the number of allocated symbols for TBoMS would be the same in each slot (i.e. TDRA Option 1 (210) illustrated in FIG. 2), a large TB is calculated by considering the sum of several PUSCH resources on multiple slots (i.e. multiple slots are bundled by scaling TB size so a payload may be encoded as a single TB), and the TB is rate-matched and transmitted on each slot using a different redundancy version (i.e. RV cycling). This solution only considers RV cycling across PUSCH segments for TBoMS where a PUSCH segment is within a slot, not over multiple slots; enabling a PUSCH segment that spans multiple slots is not considered. Example embodiments of the present disclosure may address or relate to issues associated with this solution for TBoMS. Example embodiments of the present disclosure may relate to RV cycling across PUSCH segments where a PUSCH segment is transmitted over/spans multiple slots.

According to typical operations as per new-radio (NR) specification, encoded bits of a transport block are fed into a circular buffer. The transport block may be split in multiple code blocks. A starting point in the circular buffer is defined for a redundancy version (RV). For transmitting the encoded bits on a PUSCH resource using a redundancy version, the encoded bits are read out from the starting point associated with the redundancy version in the buffer. Bits wrap around to the beginning of the buffer if the end of the buffer is reached. $RV_0$ and/or $RV_3$ may be used to transmit at least some systematic bits, while other RVs may be used to transmit parity bits, although this is not required. In current specifications, the starting positions of RVs in the circular buffer are fixed and depend on the circular buffer size. The following table is copied from TS 38.212, Section 5.4.2:

TABLE 1

| $rv_{id}$ | $k_0$ | |
|---|---|---|
| | LDPC base graph 1 | LDPC base graph 2 |
| 0 | 0 | 0 |
| 1 | $\left\lceil \frac{17N_{cb}}{66Z_c} \right\rceil Z_c$ | $\left\lceil \frac{13N_{cb}}{50Z_c} \right\rceil Z_c$ |

TABLE 1-continued

| $rv_{id}$ | $k_0$ | |
|---|---|---|
| | LDPC base graph 1 | LDPC base graph 2 |
| 2 | $\left\lceil \frac{33N_{cb}}{66Z_c} \right\rceil Z_c$ | $\left\lceil \frac{25N_{cb}}{50Z_c} \right\rceil Z_c$ |
| 3 | $\left\lceil \frac{56N_{cb}}{66Z_c} \right\rceil Z_c$ | $\left\lceil \frac{43N_{cb}}{50Z_c} \right\rceil Z_c$ |

Table 1 illustrates the starting position of different redundancy versions ($k_0$) for redundancy versions 0-3. $N_{cb}$ is the circular buffer size, and $Z_c$ is the "lifting size" of the low-density parity check (LDPC) matrix.

According to the solution in R1-2101478, RV cycling is used across the allocated PUSCH segments for TBoMS to possibly ease, if applicable, UE implementation if non-contiguous slots are considered for transmitting the TBoMS (note that this solution considers TDRA Option 1, 210, in FIG. 2, i.e. PUSCH segments are of the same size and each PUSCH segment is allocated within a slot). This solution comes with some limitations, as explained in the following.

For example, in a first case the number of coded bits that can be conveyed per PUSCH segment (denoted by G) may be much smaller than the codeword size. If there are just a few PUSCH segments, it may happen that the RV cycling with a small number of PUSCH segments (and hence a small number of RVs) cannot cover the whole codeword with the current definition of $k_0$ in Table 1. This drawback never occurs for Rel-15/Rel-16 PUSCH repetition type A, where TBS is determined by the resource per slot and TB is transmitted per slot.

Figure 3:
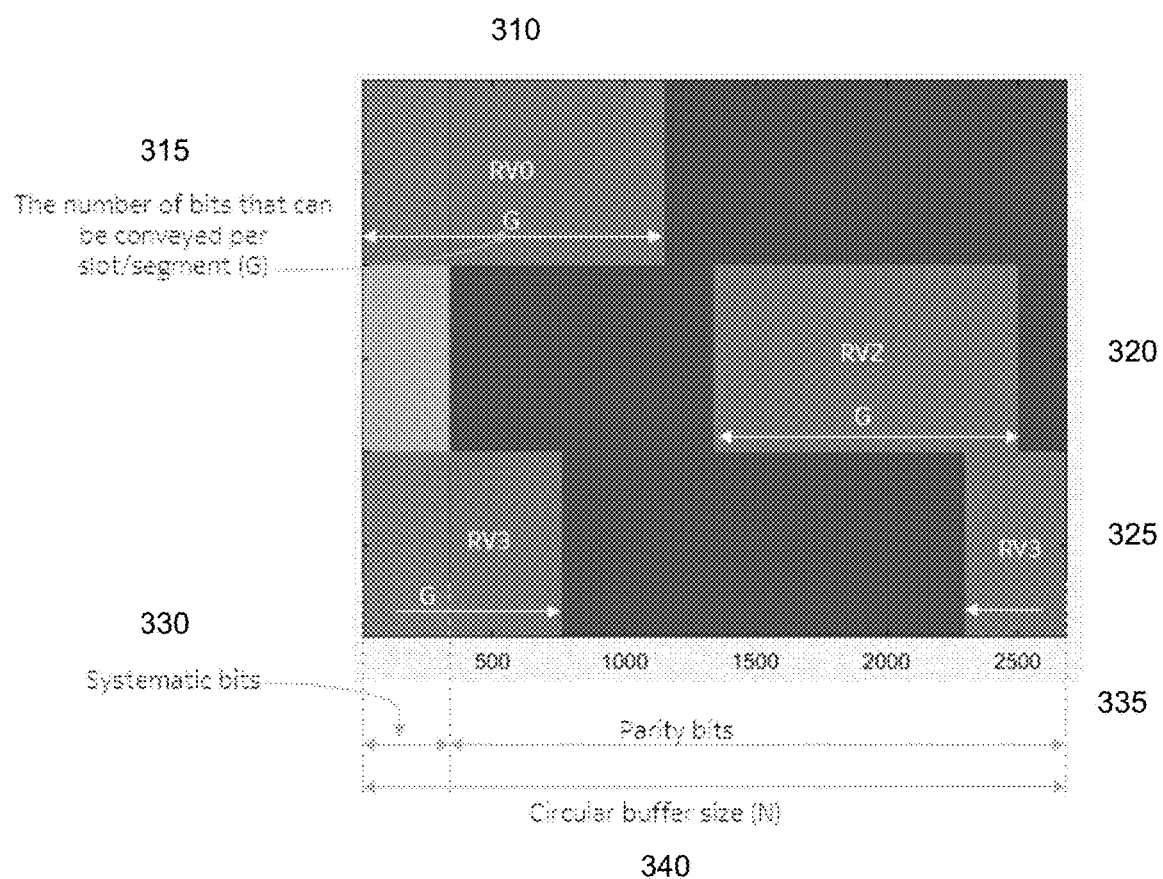
FIG. 3 is a diagram illustrating features as described herein.

Referring now to FIG. 3, illustrated is an example of RV cycling for TBoMS, and the following configuration is considered: 4 physical resource blocks (PRB), modulation and coding scheme 6 (MCS6), 2 demodulation reference signal (DMRS) symbols included per slot, TBS for TBoMS determined based on the resource of 3 slots and transmitted on the 3 slots with RV0, RV2 and RV3, respectively. In this example, RV cycling with a small number of PUSCH segments cannot cover the whole codeword due to the small value of G compared to the codeword size in TBoMS. In the example of FIG. 3, each of RV0 (310), RV2 (320), and RV3 (325) conveys/transmits/includes the same number of bits, G (315). In the example of FIG. 3, both RV0 (310) and RV3 (325) comprise at least some systematic bits, 330. The systematic bits may include an indication of TBS and/or cyclic redundancy check (CRC). In the example of FIG. 3, each of RV0 (310), RV2 (320), and RV3 (325) comprises at least some parity bits, 335. In the example of FIG. 3, the circular buffer size is N (340). In the example of FIG. 3, there is a gap between RV0 (310) and RV2 (320) that is not covered by another RV.

Figure 4:
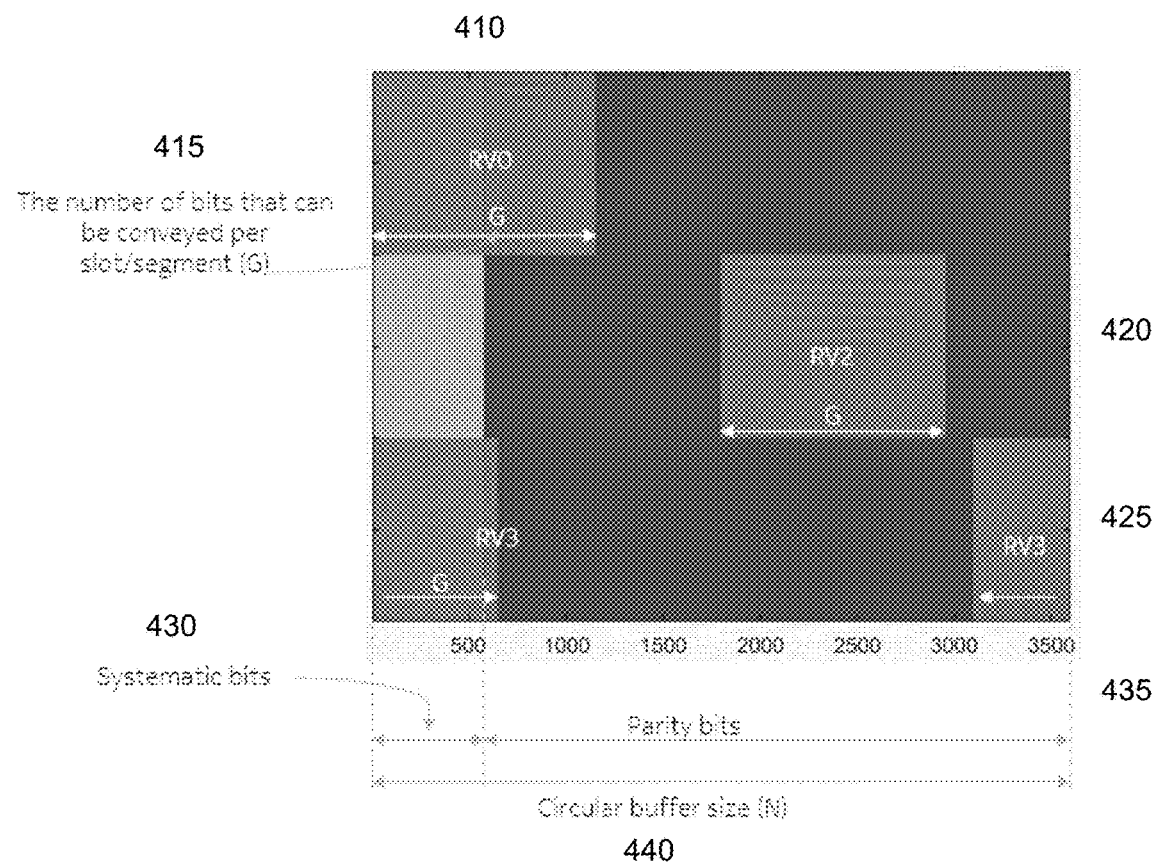
FIG. 4 is a diagram illustrating features as described herein.

Referring now to FIG. 4, illustrated is an example of RV cycling for TBoMS, and the following configuration is considered: 4PRBs, MCS9, 2 DMRS symbols included per slot, TBS for TBoMS determined based on the resource of 3 slots and TB transmitted on the 3 slots with RV0, RV2 and RV3, respectively. In this example, RV cycling with a small number of PUSCH segments cannot cover the whole codeword due to the small value of G compared to the codeword size in TBoMS, to an even greater extent than the example of FIG. 3 (i.e. due to the higher MCS). In the example of FIG. 4, each of RV0 (410), RV2 (420), and RV3 (425) conveys/transmits/includes the same number of bits, G (415). In the example of FIG. 4, both RV0 (410) and RV3 (425) comprise at least some systematic bits, 430. In the example of FIG. 4, each of RV0 (410), RV2 (420), and RV3 (425) comprises at least some parity bits, 435. In the example of FIG. 4, the circular buffer size is N (440). In the example of FIG. 3, there is a gap between RV0 (410) and RV2 (420), and a gap between RV2 (420) and RV3 (425).

A second example of a possible limitation entailed by the solution in R1-2101478 follows. In case of TBoMS that spans across a large number of PUSCH segments, rate-matching a large TBS determined by the resource across many PUSCH segments into the resource of a single PUSCH segment may lead to a scenario where the effective coding rate of the self-decodable redundancy versions (i.e., RV0 and RV3) becomes too high. This in fact entails that many systematic and parity bits may have to be punctured to match with the resources of one PUSCH segment. In some extreme cases, the effective coding rate per PUSCH segment could even be equal to 1, which makes these "self-decodable" RVs non-self-decodable. This issue may degrade the performance and may cause the whole codeword to be undecodable if too many systematic and parity bits are punctured, with the current definition of $k_0$ in Table 1.

Figure 5:
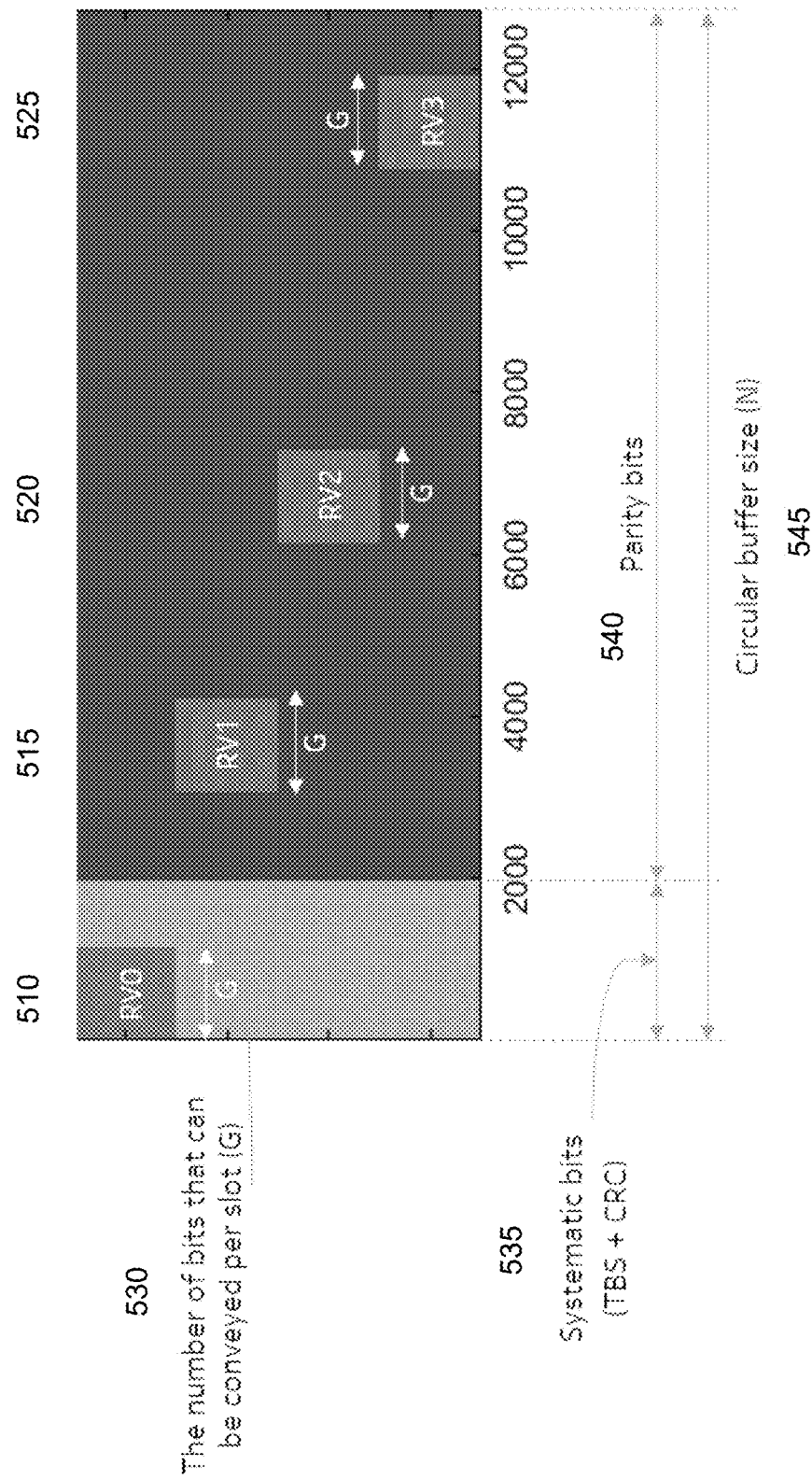
FIG. 5 is a diagram illustrating features as described herein.

Referring now to FIG. 5, illustrated is an example in which G is significantly smaller than the TBS. Hence, the effective coding rate of the "self-decodable" redundancy versions (i.e., RV0 and RV3) may be equal to 1 (e.g. for RV0) or 0 (e.g. for RV3), making them non-self-decodable. In the example of FIG. 5, the whole codeword might be undecodable. FIG. 5 illustrates an example of the number of bits that can be conveyed per slot (G) (i.e. the number of bits that can be extracted from the circular buffer for each RV) where the TBS is significantly larger than G. In this example, configuration is: 4PRBs, MCS9, 2 DMRS included per slot, and TBS for TBoMS determined based on the resource of 8 slots (8 repetitions). In the example of FIG. 5, each of RV0 (510), RV1 (515), RV2 (520), and RV3 (525) conveys/transmits/includes the same number of bits, G (530). In the example of FIG. 5, RV0 (510) comprises systematic bits, 535. In the example of FIG. 5, each of RV1 (515), RV2 (520), and RV3 (525) comprises parity bits, 540. In the example of FIG. 5, the circular buffer size is N (545). In the example of FIG. 5, there is a gap between RV0 (510) and RV1 (525), between RV1 (525) and RV2 (520), between RV2 (520) and RV3 (525), and between RV3 (525) and RV0 (510).

In summary, both in the case where TBoMS spans a small number of PUSCH segments and where TBoMS spans a large number of PUSCH segments, the current definition of $k_0$ as shown in Table 1 presents strong limitations in the case of a codeword transmitted in multiple PUSCH segments (TBoMS), resulting in either degraded decoding performance (e.g. FIG. 3 or 4) or even in an undecodable codeword (e.g. FIG. 5).

Features as described herein generally relate to transmission of TBoMS and may target reduction, if not full compensation, of the aforementioned drawbacks. Example embodiments of the present disclosure may involve shifting the starting position(s) of one or multiple redundancy versions ($k_0$ in Table 1). For example, in FIG. 3 this may be done by shifting RV2 (or both RV2 and RV3) towards RV0. This may enable the entire codeword to be covered by the small number of PUSCH segments, for example by covering the gap between RV0 (310) and RV2 (320) illustrated in FIG. 3. In the example of FIG. 5, one may restore the decodability of the codeword by shifting RV1 such that it may cover the remaining systematic bits that cannot be conveyed by RV0.

It should be noted that FIGS. 3, 4, and 5 are nonlimiting examples; other examples in which the PUSCH segments cannot cover a codeword or a codeword is not decodable are possible, as well as other examples in which shifting one or more RVs may enable coverage of a codeword and/or systematic bits.

Currently, as in Table 1, the starting position of a redundancy version ($k_0$) in the circular buffer may be fixed (i.e., hardcoded in the specification) based on the circular buffer size. In example embodiments of the present disclosure, the starting positions of the redundancy versions may be dynamically shifted in order to enable RV cycling with a small number of PUSCH segments to cover a whole codeword, and/or to ensure that that redundancy versions remain self-decodable. In example embodiments of the present disclosure, one or multiple redundancy versions may be shifted by the same or different offset values in the circular buffer (i.e. the starting position $k_0$ may be shifted). In an example embodiment, $k_0$ may be scaled directly. In an additional or alternative example embodiment, new offset values for scaling $k_0$ may be introduced. In an additional or alternative example embodiment, new starting positions for RVs may be introduced that are not based on the legacy fixed starting position $k_0$.

In an example embodiment, $k_0$ of the current RV may be defined to be the same as the ending position of the previous RV. This may result in all back-to-back RVs across the circular buffer. With this solution, $k_0$ of $RV_i$ (denoted by $k_0^{RV_i}$) may be determined by:

$$k_0^{RV_i} = \mathrm{mod}(k_0^{RV_{i-1}} + G_{i-1}, N_{cb}), \forall i \in \{1,2,3\},$$

where mod(A,B) is a modulo function which returns the remainder of the division of A by B, $k_0^{RV_0}=0$, $G_{i-1}$ is the length of $RV_{i-1}$ in the circular buffer (i.e. the number of coded bits that can be conveyed by the PUSCH segment associated with $RV_{i-1}$), and $N_{cb}$ is the circular buffer size. In this example embodiment, the legacy $k_0$ in Table 1 might not be needed. In this example, there are four redundancy versions ($RV_0$, $RV_1$, $RV_2$, $RV_3$), but more or fewer redundancy versions may be used. In this example, the length $G_i$ of each $RV_i$ may be the same size or different sizes, as RV size depends on the length of the associated PUSCH segment(s). In this example, TDRA Option 1 (210) and/or TDRA Option 2 (230) illustrated in FIG. 2 may be considered.

In an example embodiment, the location of a RV in the circular buffer may be shifted by directly scaling $k_0$ by a scaling factor $\alpha$, so that the new starting position of the RV is defined by:

$$k_{0,shifted}^{RV_i} = \mathrm{mod}(\alpha_i \times k_0^{RV_i}, N_{cb}), \forall i \in \{0,1,2,3\},$$

where mod(A,B) is a modulo function which returns the remainder of the division of A by B, $N_{cb}$ is the circular buffer size, $k_0^{RV_i}$ is the legacy $k_0$ of $RV_i$ in Table 1, and $\alpha_i$ is the scaling factor for the starting position of $RV_i$. In this example, there are four redundancy versions ($RV_0$, $RV_1$, $RV_2$, $RV_3$), but more or fewer redundancy versions may be used. In this example, TDRA Option 1 (210) and/or TDRA Option 2 (230) illustrated in FIG. 2 may be considered.

Figure 6:
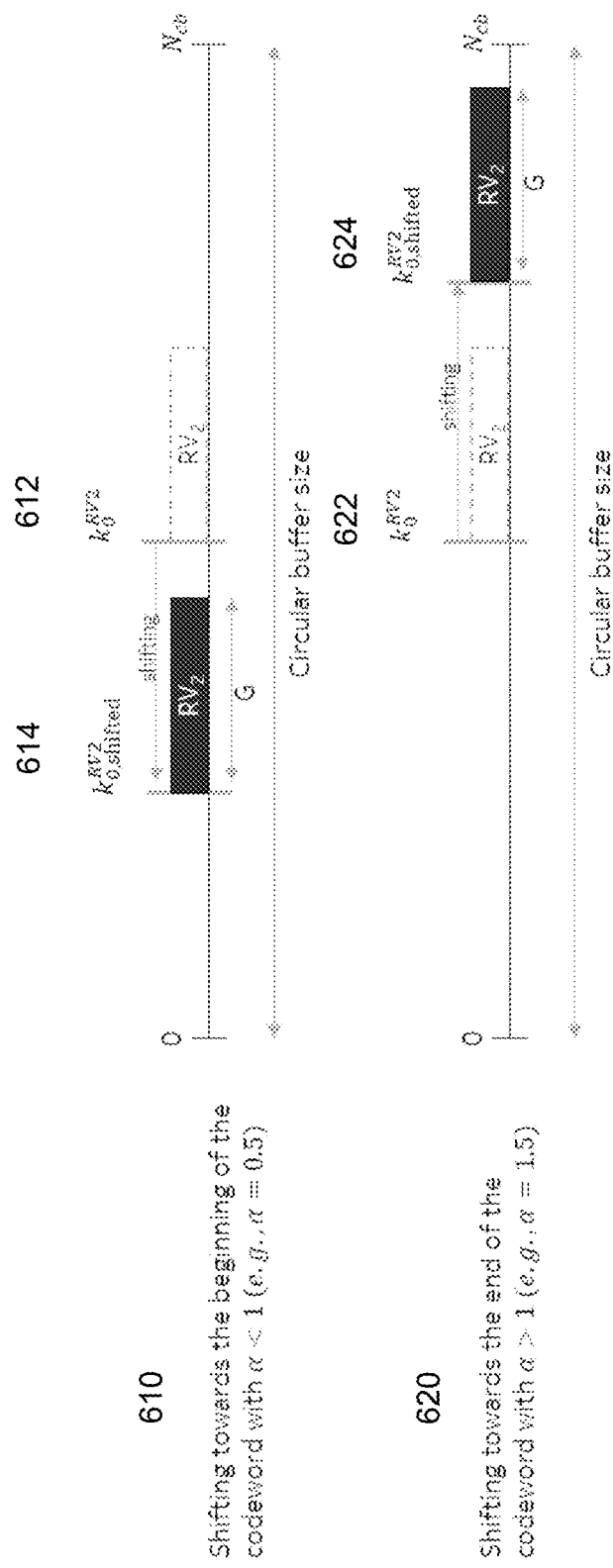
FIG. 6 is a diagram illustrating features as described herein.

As illustrated in FIG. 6, the RV may be shifted towards the beginning of the codeword (i.e., the start of the circular buffer) by setting $\alpha<1$. In contrast, the RV may be shifted towards the end of the codeword (i.e., the end of the circular buffer) by setting $\alpha>1$. A gNB may determine whether to shift a given RV forwards or backwards based on the available time domain resources. For example, if the first PUSCH segment is large, a gNB may decide to set α>1, thereby shifting a second RV towards the end of the codeword and ensuring that the second RV does not overlap with the first RV.

Referring now to FIG. 6, illustrated are examples of shifting a redundancy version towards the beginning of the codeword (610) and towards the end of the codeword (620) by setting different values for a. At 610, $RV_2$ is shifted towards the beginning of the codeword with α<1 (e.g., α=0.5). According to the legacy starting position $k_0^{RV_2}$, $RV_2$ would be located later in the circular buffer, at 612, than $k_{0,shifted}^{RV_2}$, at 614. At 620, $RV_2$ is shifted towards the end of the codeword with α>1 (e.g., α=1.5). According to the legacy starting position $k_0^{RV_2}$, $RV_2$ would be located earlier in the circular buffer, at 622, than $k_{0,shifted}^{RV_2}$, at 624.

In an example embodiment, all RVs, with or without RV0 ($k_0^{RV0}=0$)), may be selected to be shifted. RV0 may be selected for shifting, but even if selected, RV0 might not be shifted in practice since $k_0^{RV0}=0$.

In an alternative example embodiment, RVs to be shifted may be selected based on an indication from a base station (e.g. gNB). The gNB may indicate that one or multiple RVs need to be shifted by including a bitmap in the scheduling downlink control information (DCI). The bitmap size may be, for example, 3 bits, which may indicate shifts for RV1, RV2 and RV3. For example, a bit map of 101 may indicate that RV1 and RV3 must be shifted. Since $k_0^{RV0}=0$ will not be shifted, RV0 may not be indicated in the bitmap. A larger or smaller bitmap may be used depending on how many redundancy versions are used.

Additionally or alternatively, in an example embodiment some combinations of RVs selection may be configured and indicated using a new field (e.g. with a smaller size) in the scheduling DCI to select which of the combinations are used. For example, with 3 RVs, there are 8 combinations of RVs that may be selected for shifting, but it may be that only 4 cases out of 8 are configured, e.g., the bitmap of the 4 cases are configured as {000,101,110,111}. In this case, 2 bits in the new DCI field may be used to select which of the configured combinations is to be used.

Additionally or alternatively, in an example embodiment, the gNB may indicate that one or multiple RVs do not need to be shifted by setting the corresponding α=1.

In an example embodiment, a single value of α may be indicated, and may be applied for all RVs that are to be shifted. In an example embodiment, a list of α values may be radio resource control (RRC) configured or hardcoded in the specification, and a field in the scheduling DCI may be used to select a value in the list. In an example embodiment, the DCI field may be a new field or an existing field. For example, the DCI field that indicates the starting RV may be used to indicate a value of α, since in case all RVs can be shifted and the PUSCH segments are of the same size, then the indication of starting RV is less important (i.e. α may be indicated instead of the starting RV). Additionally or alternatively, in an example embodiment, the value of α may be determined based on a ratio between the number of bits that can be conveyed per slot/PUSCH segment (i.e., G) and the TBS. For example, different values of α may be configured for different ranges of the ratio between G and TBS. If there are different values of G due to different segment lengths, the maximum/minimum/average value of G may be used in the ratio.

Additionally or alternatively, in an example embodiment, the value of a may be determined based on a ratio between G and the gap of the corresponding RVs of the first and second transmissions, or the longest gap of any two consecutive RVs. For example, different values of α may be configured for different ranges of the ratio between G and the longest gap of any two consecutive RVs. If there are different values of G due to different segment lengths, the maximum/minimum/average value of G may be used in the ratio. In a non-limiting example, the value of α may be determined based on a ratio between G (315) and the gap between RV0 (310) and RV2 (320) in FIG. 3. In another non-limiting example, the value of α may be determined based on a ratio between G (415) and the gap between RV0 (410) and RV2 (420) (which is larger than the gap between RV2 (420) and RV3 (425)) in FIG. 3.

In an example embodiment, different values of α may be indicated/determined for the different RVs that are to be shifted. In an example embodiment, a may be indicated by a list of different vectors of α values that may be RRC configured or hardcoded in the specification. Each vector may contain different α values for different RVs. For example, a first value of the vector may indicate an α to be applied to a first RV to be shifted, a second value of the vector may indicate a second, different α to be applied to a second, different RV to be shifted, etc. A field in the scheduling DCI may be used to select a vector in the list. In an example embodiment, the DCI field may be a new field or an existing field. An example of an existing field may be the DCI field that indicates the starting RV. In an example embodiment, the network may select the vector of α values which best approximates the actual gaps among adjacent RVs. In other words, based on information related to the gaps among the RVs, a base station (e.g. gNB) may indicate in a scheduling DCI a vector of values that matches the gaps among the RVs.

Additionally or alternatively, in an example embodiment, the value of α for a given RV may be determined by the ratio between G and the gap from the current RV to the previous RV (e.g. consecutive RVs). For example, different values of α may be configured for different ranges of the ratio between G and the gap from the current RV to the previous RV. If there are different values of G due to different segment lengths, the maximum/minimum/average value of G may be used in the ratio.

In an example embodiment, new starting positions for RVs may be introduced. Instead of shifting the RVs based on the legacy fixed starting position $k_0$, in an example embodiment, new starting position(s) may be defined for the RVs (other than RV0) based on the gap from the end of the previous RV to the start of the current RV (i.e. the gap between consecutive RVs of a circular buffer). In this example embodiment, the number of RVs may be equal to the number of PUSCH segments for TBoMS. It may be noted that this is different from the solution of R1-2101478, where the number of RVs is limited to 4, and PUSCH segments are cycled across the 4 RVs at most. The starting position for a RV may be defined as:

$$k_0^{RV_i}=\mod(k_0^{RV_{i-1}}+G_{i-1}+\beta_i N_{cb}) \forall i \in \{1,2,3, \ldots N_{SM}\},$$

where mod(A,B) is a modulo function which returns the remainder of the division of A by B, $k_0^{RV0}=0$, $G_{i-1}$ is the size of $RV_{i-1}$, $\beta_i$ the gap/scalar from the end of $RV_{i-1}$ to the start of $RV_i$ in the circular buffer, $N_{cb}$ is the circular buffer size, and $N_{SM}$ is the total number of PUSCH segments that are allocated for TBoMS. In this example embodiment, the legacy $k_0$ in Table 1 might not be needed.

Figure 7:
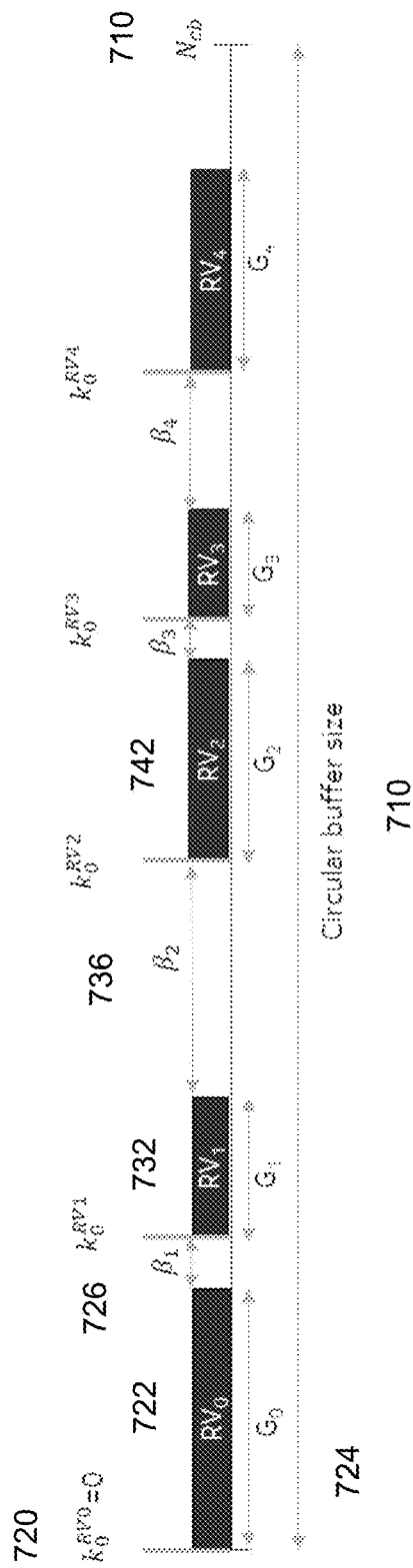
FIG. 7 is a diagram illustrating features as described herein.

Referring now to FIG. 7, illustrated is an example of defining new starting positions for the RVs. $RV_0$ (722) is the first RV, and therefore does not need to be shifted (i.e. $k_0^{RV_0}=0$ at 720). The gap/scalar between $RV_0$ (722) and RV1 (732) is $\beta_1$ (726). The size of $RV_0$ (722) is $G_0$ (724). The circular buffer size is $N_{cb}$ (710). According to the equation above, the new starting position for $RV_1$ (732) would be the modulo of $k_0^{RV_0}$ (720) (i.e. 0)+$G_0$ (724)+$\beta_1$ (726) and $N_{cb}$ (710). Based on the new starting position of $RV_1$ (732), the starting position of RV2 may be determined using the equation.

It may be noted that, in the above equation, $\beta$ is expressed in the unit of bits, which may be a very high value and hard to indicate. In an example embodiment, the entire buffer size may be quantized into unit of multiple of bits, i.e., with coarser granularity, where one unit is defined by, for example, $$u = \left\lfloor \frac{N_{cb}}{M} \right\rfloor$$

where $\lfloor A \rfloor$ returns the closest integer number that is smaller than A, and where M may be selected by a base station (e.g. gNB). Hence, $\beta$ may be indicated by a multiple of u, i.e. $\beta=c \times u$. M and c may be hardcoded in the specification or semi-statically configured in RRC. Additionally or alternatively, a DCI field may also be used to select M and c from a list of multiple values that may be hardcoded or semi-statically configured in RRC. In an example embodiment, M may be configured in RRC, and c may be indicated using DCI.

In an example embodiment where the gap/scalar $\beta_i$ from the end of $RV_{i-1}$ to the start of $RV_i$ in the circular buffer is the same for all RVs, the gap/scalar $\beta_i$ may be indicated with M and c via RRC and/or DCI.

When different gaps/scalars are applied across the RVs, there may be an issue where the number of PUSCH segments may be different for different TBoMSs. Configuring a list of multiple vectors where each vector contains all RVs may be too computationally heavy, if not impossible, given that the size of the vector (i.e., the number of RVs) may vary from one TBoMS to another. In an example embodiment, a fixed length L may be defined for the vector (i.e. L values are included in the vector) and these L values of $\beta$ and/or c may be cycled across the RVs. In a non-limiting example where a vector comprises two $\beta$ and c values to be applied to four RVs, a first $\beta$ and c value may be applied to RV1 and RV3, while a second $\beta$ and c value may be applied to RV2 and RV4. For indication, a list of multiple vectors where each vector contains L values of $\beta$ and/or c may be hardcoded in the specifications or may be RRC configured. The base station (e.g. gNB) may indicate which vector is used, for example, by using DCI.

In example embodiments of the present disclosure, it may be assumed that the RV index is the same as PUSCH segment index, i.e. $RV_i$ may be assigned to $i^{th}$ PUSCH segment. However, this might not always be the case.

In another example embodiment, $RV_0$ may be allocated to the largest PUSCH segment, which may result in a circular shift of the allocation of the RV indices in the circular buffer, but the order of PUSCH segments may remain the same. In practice, in such a design, RV index and PUSCH segment index may be different. For instance, in a non-limiting example, let PUSCH0, PUSCH1, PUSCH2 and PUSCH3 be 4 PUSCH segments, where PUSCH2 is the largest. Let G0, G1, G2, G3 be the corresponding G for these PUSCH segments. According to the considered example embodiment, instead of allocating RV0 to G0 (i.e. first bit in buffer), RV0 may be allocated to G2. Then the cycle across Gs and RVs would read: G2 (RV0), G3(RV1), G0(RV2) G1(RV3). In addition, this circularly shifted allocation of $RV_0$ to the largest PUSCH segment may free up the existing field of DCI indicating the starting RV index, which may instead be used to indicate $\beta$ and/or c as described above (i.e. the DCI field otherwise used to indicate a starting RV index may be repurposed for another use, such as indicating $\beta$ and/or c, etc.).

In an example embodiment, a trigger may be implemented so that both gNB and UE can use the same approach of determining the starting positions of the RVs ($k_0$) where both legacy RV cycling and at least one of the proposed RV shifting methods above may be used for TBoMS.

In an example embodiment, the trigger may be implemented with an explicit indication. For example, the gNB may indicate whether legacy RV cycling or a new RV shifting solution is to be applied by semi-statically configuring this information in RRC signaling, and/or dynamically indicating this information in the scheduling DCI of the TBoMS.

In an example embodiment, indication in the scheduling DCI may be done by introducing a new separate field, or by reusing the DCI field that indicates $\alpha$ or $\beta$ in the solution above. For example, one DCI state of the indication of $\alpha$ or $\beta$ (e.g. all zero bits) may be used to indicate that legacy RV cycling is used, while other states may indicate that the new RV shifting solution is used with the indicated $\alpha$ or $\beta$ values.

In an example embodiment, the trigger may be implemented with an implicit indication. For example, both gNB and UE may determine whether a new RV shifting solution (according to an example embodiment of the present disclosure) is to be applied based on a threshold, which may be hardcoded in specifications or RRC configured. In an example embodiment, the threshold may relate to the percentage of the codeword in the circular buffer or the percentage of the systematic bits that is not covered by the RVs. For example, the non-legacy approach may be triggered where the codeword size is less than a threshold percentage of the circular buffer, and the legacy approach may be triggered where the codeword size is more than a threshold percentage of the circular buffer. For example, the non-legacy approach may be triggered where less than a threshold percentage of the systematic bits are covered by the RVs, and the legacy approach may be triggered where more than a threshold percentage of the systematic bits are covered by the RVs.

In an example embodiment, the threshold may be the ratio between G and either the TBS or the circular buffer size. In a case where the allocated PUSCH segments of the TBoMS have different lengths (i.e., there are different values of G), the G used for the ratio may be the maximum/minimum/average of the multiple G values.

In an example embodiment, the threshold may be a gap between two consecutive RVs, or the ratio between G and a gap between two consecutive RVs. The gap may be the maximum or minimum gap between any two consecutive RVs. In an example, the gap may be the gap between the first and the second RV, where the first RV starts from the beginning of circular buffer (i.e., the first RV always contains systematic bits). In case the allocated PUSCH segments of the TBoMS have different lengths (i.e., there are different values of G), the G used for the ratio may be the maximum/minimum/average of the multiple G values, or G may take the value associated with one of the two RVs that are used to compute the gap.

Figure 8:
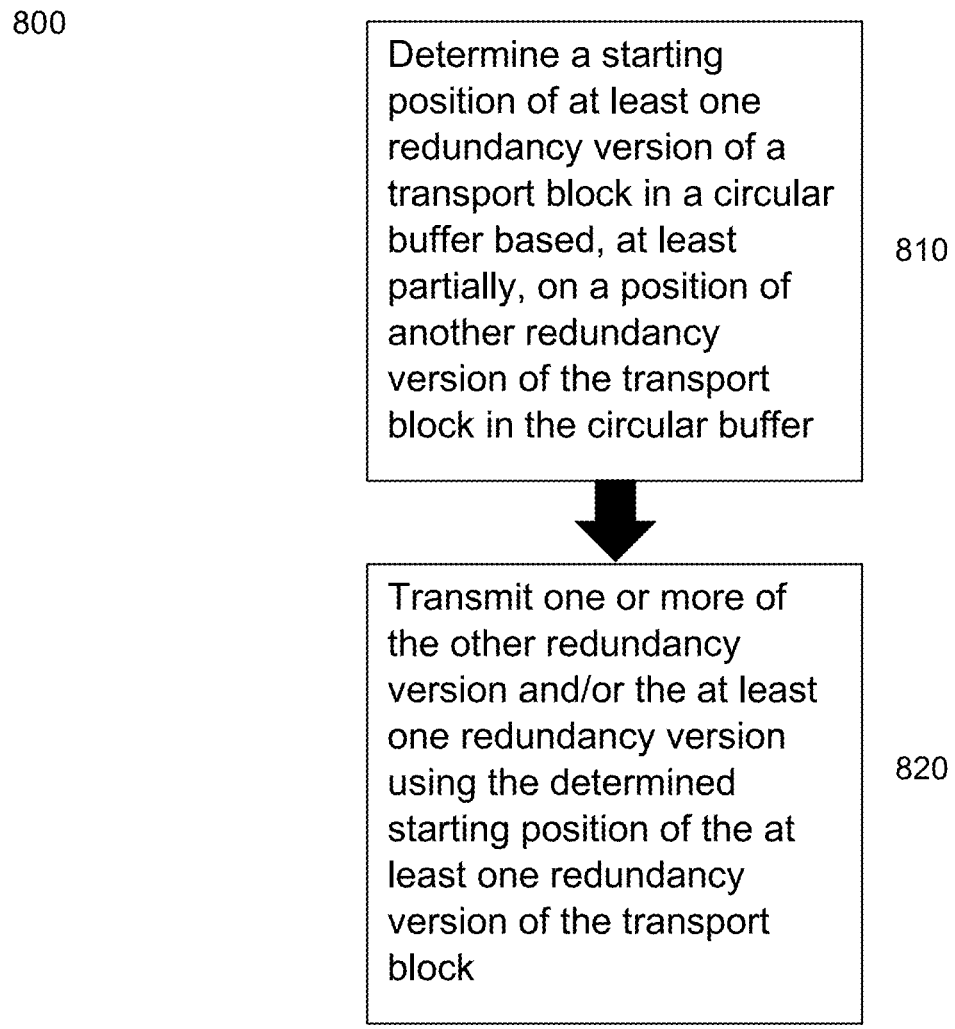
FIG. 8 is a flowchart illustrating steps as described herein.

FIG. 8 illustrates the potential steps of an example method 800. The example method 800 may include: determining a starting position of at least one redundancy version of a transport block in a circular buffer based, at least partially, on a position of another redundancy version of the transport block in the circular buffer, 810; and transmitting one or more of the other redundancy version and/or the at least one redundancy version using the determined starting position of the at least one redundancy version of the transport block, 820. It may be noted that only one of the at least one redundancy version is transmitted, multiple redundancy versions of the at least one redundancy version is transmitted, or the other redundancy version and some number of the at least one redundancy version are transmitted.

FIG. 9 illustrates the potential steps of an example method 900. The example method 900 may include: scaling a predetermined starting position of at least one redundancy version of encoded bits of a transport block in a circular buffer based, at least partially, on a scaling factor, 910; and transmitting at least the at least one redundancy version using the scaled starting position of the at least one redundancy version of the transport block, 920.

FIG. 10 illustrates the potential steps of an example method 1000. The example method 1000 may include: determining whether a user equipment should use a first method to determine a starting position of at least one redundancy version of a transport block in a circular buffer or a second method to determine the starting position of the at least one redundancy version of the transport block in the circular buffer, wherein the second method comprises determining the starting position of the at least one redundancy version based, at least partially, on one of: a position of another redundancy version of the transport block in the circular buffer, or a scaling factor, 1010; and transmitting an indication to determine the starting position of the at least one redundancy version based on at least one of the first method or the second method, 1020.

A technical effect of example embodiments of the present disclosure may be to improved decoding performance due to avoiding limitations of current solutions for codeword transmittal in multiple PUSCH segments (TBoMS).

In accordance with one example embodiment, an apparatus may comprise: at least one processor; and at least one memory including computer program code; the at least one memory and the computer program code configured to, with the at least one processor, cause the apparatus to: determine a starting position of at least one redundancy version of a transport block in a circular buffer based, at least partially, on a position of another redundancy version of the transport block in the circular buffer; and transmit one or more of the other redundancy version and/or the at least one redundancy version using the determined starting position of the at least one redundancy version of the transport block.

Determining the starting position of the at least one redundancy version may comprise the example apparatus being further configured to: set the starting position of the at least one redundancy version to be the same as an ending position of the other redundancy version.

Determining the starting position of the at least one redundancy version may comprise the example apparatus being further configured to: determine a remainder of: a division of a starting position of the other redundancy version plus a length of the other redundancy version, and a size of the circular buffer, wherein the determined starting position may comprise the determined remainder.

Determining the starting position of the at least one redundancy version may comprise the example apparatus being further configured to: determine the starting position of the at least one redundancy version based, at least partially, on at least one scalar.

A number of redundancy versions of the transport block may be equal to a number of physical uplink shared channel segments used for transport block over multiple segment transmission.

Determining the starting position of the at least one redundancy version may comprise the example apparatus being further configured to: determine a remainder of a division of: a starting position of the other redundancy version plus a size of the other redundancy version plus a scalar of the at least one scalar, and a size of the circular buffer, wherein the determined starting position may comprise the determined remainder.

The example apparatus may be further configured to: determine a first value and a second value; and determine the scalar of the at least one scalar, wherein determining the scalar may comprise multiplying the first value by a closest integer number smaller than the circular buffer size divided by the second value.

Determining the first value and the second value may comprise the example apparatus being further configured to at least one of: receive a radio resource control configuration of at least one of the first value or the second value, determine at least one of the first value or the second value based on a specification, or receive an indication of at least one of the first value or the second value in a downlink control information field.

The example apparatus may be further configured to: determine the at least one scalar based, at least partially, on an indication of a vector, wherein the vector may comprise information for determining a number of scalars of the at least one scalar that is less than a number of redundancy versions of the at least one redundancy version, and wherein the determined number of the at least one scalar may be cycles across the redundancy versions of the at least one redundancy version.

In accordance with one example embodiment, an apparatus may comprise: at least one processor; and at least one memory including computer program code; the at least one memory and the computer program code configured to, with the at least one processor, cause the apparatus to: scale a predetermined starting position of at least one redundancy version of encoded bits of a transport block in a circular buffer based, at least partially, on a scaling factor; and transmit at least the at least one redundancy version using the scaled starting position of the at least one redundancy version of the transport block.

Scaling the predetermined starting position of the at least one redundancy version may comprise the example apparatus being further configured to: determine a remainder of a division of: the predetermined starting position multiplied by the scaling factor, and a size of the circular buffer, wherein the scaled starting position may comprise the determined remainder.

The scaling factor may be configured to scale the predetermined starting position of the at least one redundancy version towards a beginning or an ending of a codeword.

The scaling factor may comprise a single scaling factor applicable to a plurality of redundancy versions.

The example apparatus may be further configured to: determine the scaling factor based on a list of values determined based on one of: a specification, a radio resource control configuration, or a system information block configuration, and a field in a scheduling downlink control information configured to select a value from the list of values.

The example apparatus may be further configured to: determine the scaling factor based on a ratio between a number of bits conveyed per physical uplink shared channel segment in the circular buffer and a size of the transport block.

The example apparatus may be further configured to: determine the scaling factor based on a ratio between a number of bits conveyed per physical uplink shared channel segment in the circular buffer and one of: a size of a gap between an ending position of a first redundancy version and an earliest predetermined starting position of the at least one redundancy version, or a largest size of a gap between consecutive redundancy versions of a first redundancy version and the at least one redundancy version.

The number of bits conveyed per physical uplink shared channel segment in the circular buffer may comprise one of: a maximum number of bits per physical uplink shared channel segment in the circular buffer, a minimum number of bits per physical uplink shared channel segment in the circular buffer, or an average number of bits per physical uplink shared channel segment in the circular buffer.

The example apparatus may be further configured to: determine the scaling factor based, at least partially, on a vector of scaling factors, wherein a scaling factor of the vector of scaling factors may correspond to a redundancy version of the at least one redundancy version.

The example apparatus may be further configured to: select the vector of scaling factors from a plurality of vectors of scaling factors based on a field of a downlink control information.

The example apparatus may be further configured to: receive an indication to determine the starting position of one of: all the at least one redundancy version, or at least one of the at least one redundancy version.

The indication may be based on at least one of: a bitmap received in scheduling downlink control information, an indication included in radio resource control signaling, an indication included in system information block, an indication included in a downlink control information message, an indication included in a specification, a percentage of codeword size not covered by at least one of the at least one redundancy version or the other redundancy version, a number of systematic bits not covered by at least one of the at least one redundancy version or the other redundancy version, a ratio between a size of a redundancy version of the at least one redundancy version and a size of the transport block, a ratio between a size of a redundancy version of the at least one redundancy version and the size of the circular buffer, a gap between two consecutive redundancy versions of the other redundancy version and the at least one redundancy version, or a ratio between the size of the redundancy version of the at least one redundancy version and the gap between two consecutive redundancy versions.

The gap between two consecutive redundancy versions may comprise one of: a maximum gap between two consecutive redundancy versions of the other redundancy version and the at least one redundancy version, or a minimum gap between two consecutive redundancy versions of the other redundancy version and the at least one redundancy version.

At least one of the at least one redundancy version or the other redundancy version may be configured to transmit at least one of a plurality of physical uplink shared channel segments used for the transport block over multiple segment transmission.

At least the one of the plurality of physical uplink shared channel segments may span across multiple slots.

In accordance with one aspect, an example method may be provided comprising: determining a starting position of at least one redundancy version of a transport block in a circular buffer based, at least partially, on a position of another redundancy version of the transport block in the circular buffer; and transmitting one or more of the other redundancy version and/or the at least one redundancy version using the determined starting position of the at least one redundancy version of the transport block.

The determining of the starting position of the at least one redundancy version may comprise: setting the starting position of the at least one redundancy version to be the same as an ending position of the other redundancy version.

The determining of the starting position of the at least one redundancy version may comprise: determining a remainder of: a division of a starting position of the other redundancy version plus a length of the other redundancy version, and a size of the circular buffer, wherein the determined starting position comprises the determined remainder.

The determining of the starting position of the at least one redundancy version may comprise determining the starting position of the at least one redundancy version based, at least partially, on at least one scalar.

A number of redundancy versions of the transport block may be equal to a number of physical uplink shared channel segments used for transport block over multiple segment transmission.

The determining of the starting position of the at least one redundancy version may comprise determining a remainder of a division of: a starting position of the other redundancy version plus a size of the other redundancy version plus a scalar of the at least one scalar, and a size of the circular buffer, wherein the determined starting position may comprise the determined remainder.

The example method may further comprise: determining a first value and a second value; and determining the scalar of the at least one scalar, wherein the determining of the scalar may comprise multiplying the first value by a closest integer number smaller than the circular buffer size divided by the second value.

The determining of the first value and the second value may comprise at least one of: receiving a radio resource control configuration of at least one of the first value or the second value, determining at least one of the first value or the second value based on a specification, or receiving an indication of at least one of the first value or the second value in a downlink control information field.

The example method may further comprise: determining the at least one scalar based, at least partially, on an indication of a vector, wherein the vector may comprise information for determining a number of scalars of the at least one scalar that is less than a number of redundancy versions of the at least one redundancy version, and wherein the determined number of the at least one scalar may be cycles across the redundancy versions of the at least one redundancy version.

In accordance with one aspect, an example method may be provided comprising: scaling a predetermined starting position of at least one redundancy version of encoded bits of a transport block in a circular buffer based, at least partially, on a scaling factor; and transmitting at least the at least one redundancy version using the scaled starting position of the at least one redundancy version of the transport block.

The scaling of the predetermined starting position of the at least one redundancy version may comprise determining a remainder of a division of: the predetermined starting position multiplied by the scaling factor, and a size of the circular buffer, wherein the scaled starting position may comprise the determined remainder.

The scaling factor may be configured to scale the predetermined starting position of the at least one redundancy version towards a beginning or an ending of a codeword.

The scaling factor may comprise a single scaling factor applicable to a plurality of redundancy versions.

The example method may further comprise: determining the scaling factor based on a list of values determined based on one of: a specification, a radio resource control configuration, or a system information block configuration, and a field in a scheduling downlink control information configured to select a value from the list of values.

The example method may further comprise: determining the scaling factor based on a ratio between a number of bits conveyed per physical uplink shared channel segment in the circular buffer and a size of the transport block.

The example method may further comprise: determining the scaling factor based on a ratio between a number of bits conveyed per physical uplink shared channel segment in the circular buffer and one of: a size of a gap between an ending position of a first redundancy version and an earliest predetermined starting position of the at least one redundancy version, or a largest size of a gap between consecutive redundancy versions of a first redundancy version and the at least one redundancy version.

The number of bits conveyed per physical uplink shared channel segment in the circular buffer may comprise one of: a maximum number of bits per physical uplink shared channel segment in the circular buffer, a minimum number of bits per physical uplink shared channel segment in the circular buffer, or an average number of bits per physical uplink shared channel segment in the circular buffer.

The example method may further comprise: determining the scaling factor based, at least partially, on a vector of scaling factors, wherein a scaling factor of the vector of scaling factors may correspond to a redundancy version of the at least one redundancy version.

The example method may further comprise: selecting the vector of scaling factors from a plurality of vectors of scaling factors based on a field of a downlink control information.

The example method may further comprise: receiving an indication to determine the starting position of one of: all the at least one redundancy version, or at least one of the at least one redundancy version.

The indication may be based on at least one of: a bitmap received in scheduling downlink control information, an indication included in radio resource control signaling, an indication included in system information block, an indication included in a downlink control information message, an indication included in a specification, a percentage of codeword size not covered by at least one of the at least one redundancy version or the other redundancy version, a number of systematic bits not covered by at least one of the at least one redundancy version or the other redundancy version, a ratio between a size of a redundancy version of the at least one redundancy version and a size of the transport block, a ratio between a size of a redundancy version of the at least one redundancy version and the size of the circular buffer, a gap between two consecutive redundancy versions of the other redundancy version and the at least one redundancy version, or a ratio between the size of the redundancy version of the at least one redundancy version and the gap between two consecutive redundancy versions.

The gap between two consecutive redundancy versions may comprise one of: a maximum gap between two consecutive redundancy versions of the other redundancy version and the at least one redundancy version, or a minimum gap between two consecutive redundancy versions of the other redundancy version and the at least one redundancy version.

At least one of the at least one redundancy version or the other redundancy version may be configured to transmit at least one of a plurality of physical uplink shared channel segments used for the transport block over multiple segment transmission.

At least the one of the plurality of physical uplink shared channel segments may span across multiple slots.

In accordance with one example embodiment, an apparatus may comprise: circuitry configured to perform: determine a starting position of at least one redundancy version of a transport block in a circular buffer based, at least partially, on a position of another redundancy version of the transport block in the circular buffer; and transmit one or more of the other redundancy version and/or the at least one redundancy version using the determined starting position of the at least one redundancy version of the transport block.

In accordance with one example embodiment, an apparatus may comprise: processing circuitry; memory circuitry including computer program code, the memory circuitry and the computer program code configured to, with the processing circuitry, enable the apparatus to: determine a starting position of at least one redundancy version of a transport block in a circular buffer based, at least partially, on a position of another redundancy version of the transport block in the circular buffer; and transmit one or more of the other redundancy version and/or the at least one redundancy version using the determined starting position of the at least one redundancy version of the transport block.

In accordance with one example embodiment, an apparatus may comprise: circuitry configured to perform: scale a predetermined starting position of at least one redundancy version of encoded bits of a transport block in a circular buffer based, at least partially, on a scaling factor; and transmit at least the at least one redundancy version using the scaled starting position of the at least one redundancy version of the transport block.

In accordance with one example embodiment, an apparatus may comprise: processing circuitry; memory circuitry including computer program code, the memory circuitry and the computer program code configured to, with the processing circuitry, enable the apparatus to: scale a predetermined starting position of at least one redundancy version of encoded bits of a transport block in a circular buffer based, at least partially, on a scaling factor; and transmit at least the at least one redundancy version using the scaled starting position of the at least one redundancy version of the transport block.

As used in this application, the term "circuitry" may refer to one or more or all of the following: (a) hardware-only circuit implementations (such as implementations in only analog and/or digital circuitry) and (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions) and (c) hardware circuit(s) and or processor(s), such as a microprocessor(s) or a portion of a microprocessor(s), that requires software (e.g., firmware) for operation, but the software may not be present when it is not needed for operation." This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

In accordance with one example embodiment, an apparatus may comprise means for performing: determining a starting position of at least one redundancy version of a transport block in a circular buffer based, at least partially, on a position of another redundancy version of the transport block in the circular buffer; and transmitting one or more of the other redundancy version and/or the at least one redundancy version using the determined starting position of the at least one redundancy version of the transport block.

The means configured to perform determining of the starting position of the at least one redundancy version may comprise means configured to perform: setting the starting position of the at least one redundancy version to be the same as an ending position of the other redundancy version.

The means configured to perform determining of the starting position of the at least one redundancy version may comprise means configured to perform: determining a remainder of: a division of a starting position of the other redundancy version plus a length of the other redundancy version, and a size of the circular buffer, wherein the determined starting position may comprise the determined remainder.

The means configured to perform determining of the starting position of the at least one redundancy version may comprise means configured to perform determining the starting position of the at least one redundancy version based, at least partially, on at least one scalar.

A number of redundancy versions of the transport block may be equal to a number of physical uplink shared channel segments used for transport block over multiple segment transmission.

The means configured to perform determining of the starting position of the at least one redundancy version may comprise means configured to perform determining a remainder of a division of: a starting position of the other redundancy version plus a size of the other redundancy version plus a scalar of the at least one scalar, and a size of the circular buffer, wherein the determined starting position may comprise the determined remainder.

The means may be further configured to perform: determining a first value and a second value; and determining the scalar of the at least one scalar, wherein the determining of the scalar may comprise multiplying the first value by a closest integer number smaller than the circular buffer size divided by the second value.

The means configured to perform determining of the first value and the second value may comprise means configured to perform at least one of: receiving a radio resource control configuration of at least one of the first value or the second value, determining at least one of the first value or the second value based on a specification, or receiving an indication of at least one of the first value or the second value in a downlink control information field.

The means may be further configured to perform: determining the at least one scalar based, at least partially, on an indication of a vector, wherein the vector may comprise information for determining a number of scalars of the at least one scalar that is less than a number of redundancy versions of the at least one redundancy version, and wherein the determined number of the at least one scalar may be cycles across the redundancy versions of the at least one redundancy version.

The means may be further configured to perform: scaling a predetermined starting position of at least one redundancy version of encoded bits of a transport block in a circular buffer based, at least partially, on a scaling factor; and transmitting at least the at least one redundancy version using the scaled starting position of the at least one redundancy version of the transport block.

The means configured to perform scaling of the predetermined starting position of the at least one redundancy version may comprise means configured to perform determining a remainder of a division of: the predetermined starting position multiplied by the scaling factor, and a size of the circular buffer, wherein the scaled starting position may comprise the determined remainder.

The scaling factor may be configured to scale the predetermined starting position of the at least one redundancy version towards a beginning or an ending of a codeword.

The scaling factor may comprise a single scaling factor applicable to a plurality of redundancy versions.

The means may be further configured to perform: determining the scaling factor based on a list of values determined based on one of: a specification, a radio resource control configuration, or a system information block configuration, and a field in a scheduling downlink control information configured to select a value from the list of values.

The means may be further configured to perform: determining the scaling factor based on a ratio between a number of bits conveyed per physical uplink shared channel segment in the circular buffer and a size of the transport block.

The means may be further configured to perform: determining the scaling factor based on a ratio between a number of bits conveyed per physical uplink shared channel segment in the circular buffer and one of: a size of a gap between an ending position of a first redundancy version and an earliest predetermined starting position of the at least one redundancy version, or a largest size of a gap between consecutive redundancy versions of a first redundancy version and the at least one redundancy version.

The number of bits conveyed per physical uplink shared channel segment in the circular buffer may comprise one of: a maximum number of bits per physical uplink shared channel segment in the circular buffer, a minimum number of bits per physical uplink shared channel segment in the circular buffer, or an average number of bits per physical uplink shared channel segment in the circular buffer.

The means may be further configured to perform: determining the scaling factor based, at least partially, on a vector of scaling factors, wherein a scaling factor of the vector of scaling factors may correspond to a redundancy version of the at least one redundancy version.

The means may be further configured to perform: selecting the vector of scaling factors from a plurality of vectors of scaling factors based on a field of a downlink control information.

The means may be further configured to perform: receiving an indication to determine the starting position of one of: all the at least one redundancy version, or at least one of the at least one redundancy version.

The indication may be based on at least one of: a bitmap received in scheduling downlink control information, an indication included in radio resource control signaling, an indication included in system information block, an indication included in a downlink control information message, an indication included in a specification, a percentage of codeword size not covered by at least one of the at least one redundancy version or the other redundancy version, a number of systematic bits not covered by at least one of the at least one redundancy version or the other redundancy version, a ratio between a size of a redundancy version of the at least one redundancy version and a size of the transport block, a ratio between a size of a redundancy version of the at least one redundancy version and the size of the circular buffer, a gap between two consecutive redundancy versions of the other redundancy version and the at least one redundancy version, or a ratio between the size of the redundancy version of the at least one redundancy version and the gap between two consecutive redundancy versions.

The gap between two consecutive redundancy versions may comprise one of: a maximum gap between two consecutive redundancy versions of the other redundancy version and the at least one redundancy version, or a minimum gap between two consecutive redundancy versions of the other redundancy version and the at least one redundancy version.

At least one of the at least one redundancy version or the other redundancy version may be configured to transmit at least one of a plurality of physical uplink shared channel segments used for the transport block over multiple segment transmission.

At least the one of the plurality of physical uplink shared channel segments may span across multiple slots.

In accordance with one example embodiment, a non-transitory computer-readable medium comprising program instructions stored thereon which, when executed with at least one processor, cause the at least one processor to: determine a starting position of at least one redundancy version of a transport block in a circular buffer based, at least partially, on a position of another redundancy version of the transport block in the circular buffer; and transmit one or more of the other redundancy version and/or the at least one redundancy version using the determined starting position of the at least one redundancy version of the transport block.

Determining the starting position of the at least one redundancy version may comprise the example non-transitory computer-readable medium being further configured to: set the starting position of the at least one redundancy version to be the same as an ending position of the other redundancy version.

Determining the starting position of the at least one redundancy version may comprise the example non-transitory computer-readable medium being further configured to: determine a remainder of: a division of a starting position of the other redundancy version plus a length of the other redundancy version, and a size of the circular buffer, wherein the determined starting position may comprise the determined remainder.

Determining the starting position of the at least one redundancy version may comprise the example non-transitory computer-readable medium being further configured to: determine the starting position of the at least one redundancy version based, at least partially, on at least one scalar.

A number of redundancy versions of the transport block may be equal to a number of physical uplink shared channel segments used for transport block over multiple segment transmission.

Determining the starting position of the at least one redundancy version may comprise the example non-transitory computer-readable medium being further configured to: determine a remainder of a division of: a starting position of the other redundancy version plus a size of the other redundancy version plus a scalar of the at least one scalar, and a size of the circular buffer, wherein the determined starting position may comprise the determined remainder.

The example non-transitory computer-readable medium may be further configured to: determine a first value and a second value; and determine the scalar of the at least one scalar, wherein determining the scalar may comprise multiplying the first value by a closest integer number smaller than the circular buffer size divided by the second value.

Determining the first value and the second value may comprise the example non-transitory computer-readable medium being further configured to: receive a radio resource control configuration of at least one of the first value or the second value, determine at least one of the first value or the second value based on a specification, or receive an indication of at least one of the first value or the second value in a downlink control information field.

The example non-transitory computer-readable medium may be further configured to: cause the at least one processor to determine the at least one scalar based, at least partially, on an indication of a vector, wherein the vector may comprise information for determining a number of scalars of the at least one scalar that is less than a number of redundancy versions of the at least one redundancy version, and wherein the determined number of the at least one scalar may be cycles across the redundancy versions of the at least one redundancy version.

In accordance with one example embodiment, a non-transitory computer-readable medium comprising program instructions stored thereon which, when executed with at least one processor, cause the at least one processor to: scale a predetermined starting position of at least one redundancy version of encoded bits of a transport block in a circular buffer based, at least partially, on a scaling factor; and transmit at least the at least one redundancy version using the scaled starting position of the at least one redundancy version of the transport block.

Scaling the predetermined starting position of the at least one redundancy version may comprise the example non-transitory computer-readable medium being further configured to: determine a remainder of a division of: the predetermined starting position multiplied by the scaling factor, and a size of the circular buffer, wherein the scaled starting position may comprise the determined remainder.

The scaling factor may be configured to scale the predetermined starting position of the at least one redundancy version towards a beginning or an ending of a codeword.

The scaling factor may comprise a single scaling factor applicable to a plurality of redundancy versions.

The example non-transitory computer-readable medium may be further configured to: determine the scaling factor based on a list of values determined based on one of: a specification, a radio resource control configuration, or a system information block configuration, and a field in a scheduling downlink control information configured to select a value from the list of values.

The example non-transitory computer-readable medium may be further configured to: determine the scaling factor based on a ratio between a number of bits conveyed per physical uplink shared channel segment in the circular buffer and a size of the transport block.

The example non-transitory computer-readable medium may be further configured to: determine the scaling factor based on a ratio between a number of bits conveyed per physical uplink shared channel segment in the circular buffer and one of: a size of a gap between an ending position of a first redundancy version and an earliest predetermined starting position of the at least one redundancy version, or a largest size of a gap between consecutive redundancy versions of a first redundancy version and the at least one redundancy version.

The number of bits conveyed per physical uplink shared channel segment in the circular buffer may comprise one of: a maximum number of bits per physical uplink shared channel segment in the circular buffer, a minimum number of bits per physical uplink shared channel segment in the circular buffer, or an average number of bits per physical uplink shared channel segment in the circular buffer.

The example non-transitory computer-readable medium may be further configured to: determine the scaling factor based, at least partially, on a vector of scaling factors, wherein a scaling factor of the vector of scaling factors may correspond to a redundancy version of the at least one redundancy version.

The example non-transitory computer-readable medium may be further configured to: select the vector of scaling factors from a plurality of vectors of scaling factors based on a field of a downlink control information.

The example non-transitory computer-readable medium may be further configured to: receive an indication to determine the starting position of one of: all the at least one redundancy version, or at least one of the at least one redundancy version.

The indication may be based on at least one of: a bitmap received in scheduling downlink control information, an indication included in radio resource control signaling, an indication included in system information block, an indication included in a downlink control information message, an indication included in a specification, a percentage of codeword size not covered by at least one of the at least one redundancy version or the other redundancy version, a number of systematic bits not covered by at least one of the at least one redundancy version or the other redundancy version, a ratio between a size of a redundancy version of the at least one redundancy version and a size of the transport block, a ratio between a size of a redundancy version of the at least one redundancy version and the size of the circular buffer, a gap between two consecutive redundancy versions of the other redundancy version and the at least one redundancy version, or a ratio between the size of the redundancy version of the at least one redundancy version and the gap between two consecutive redundancy versions.

The gap between two consecutive redundancy versions may comprise one of: a maximum gap between two consecutive redundancy versions of the other redundancy version and the at least one redundancy version, or a minimum gap between two consecutive redundancy versions of the other redundancy version and the at least one redundancy version.

At least one of the at least one redundancy version or the other redundancy version may be configured to transmit at least one of a plurality of physical uplink shared channel segments used for the transport block over multiple segment transmission.

At least the one of the plurality of physical uplink shared channel segments may span across multiple slots.

In accordance with another example embodiment, a non-transitory program storage device readable by a machine may be provided, tangibly embodying a program of instructions executable by the machine for performing operations, the operations comprising: determining a starting position of at least one redundancy version of a transport block in a circular buffer based, at least partially, on a position of another redundancy version of the transport block in the circular buffer; and transmitting one or more of the other redundancy version and/or the at least one redundancy version using the determined starting position of the at least one redundancy version of the transport block.

In accordance with another example embodiment, a non-transitory program storage device readable by a machine may be provided, tangibly embodying a program of instructions executable by the machine for performing operations, the operations comprising: scaling a predetermined starting position of at least one redundancy version of encoded bits of a transport block in a circular buffer based, at least partially, on a scaling factor; and transmitting at least the at least one redundancy version using the scaled starting position of the at least one redundancy version of the transport block.

In accordance with one example embodiment, an apparatus may comprise: at least one processor; and at least one memory including computer program code; the at least one memory and the computer program code configured to, with the at least one processor, cause the apparatus to: determine whether a user equipment should use a first method to determine a starting position of at least one redundancy version of a transport block in a circular buffer or a second method to determine the starting position of the at least one redundancy version of the transport block in the circular buffer, wherein the second method may comprise determining the starting position of the at least one redundancy version based, at least partially, on one of: a position of another redundancy version of the transport block in the circular buffer, or a scaling factor; and transmit, from the apparatus, an indication to determine the starting position of the at least one redundancy version based on at least one of the first method or the second method.

The second method may comprise setting the starting position of the at least one redundancy version to be the same as an ending position of the other redundancy version.

The second method may comprise determining a remainder of: a division of a starting position of the other redundancy version plus a length of the other redundancy version, and a size of the circular buffer.

The second method may comprise determining the starting position of the at least one redundancy version based, at least partially, on at least one scalar.

The second method may comprise determining a remainder of a division of: a starting position of the other redundancy version plus a size of the other redundancy version plus a scalar of the at least one scalar, and a size of the circular buffer.

The example apparatus may be further configured to: transmit an indication of at least one of a first value or a second value, wherein the first value and the second value may be configured to indicate the scalar.

Transmitting the indication of at least one of the first value or the second value may comprise the example apparatus being further configured to transmit at least one of: a radio resource control configuration of at least one of the first value or the second value, or a downlink control information including the indication.

The example apparatus may be further configured to: transmit an indication of a vector, wherein the vector may comprise information for determining a number of scalars of the at least one scalar that is less than a number of redundancy versions of the at least one redundancy version, and wherein the determined number of the at least one scalar may be cycles across the redundancy versions of the at least one redundancy version.

The second method may comprise determining a remainder of a division of: the predetermined starting position multiplied by the scaling factor, and a size of the circular buffer.

The scaling factor may be configured to scale a predetermined starting position of the at least one redundancy version towards a beginning or an ending of a codeword.

The scaling factor may comprise a single scaling factor applicable to a plurality of redundancy versions.

The example apparatus may be further configured to: transmit at least one of: a radio resource control configuration, a system information block configuration, or a downlink control information comprising an indication of the scaling factor.

The indication of the scaling factor may comprise an indication of one of a plurality of scaling factors.

Transmitting the indication may comprise may comprise the example apparatus being further configured to transmit at least one of: a bitmap in scheduling downlink control information, an indication included in radio resource control signaling, an indication included in system information block, or an indication included in a downlink control information message.

At least one of the at least one redundancy version or the other redundancy version may be configured to carry at least one of a plurality of physical uplink shared channel segments used for the transport block over multiple segment transmission.

At least the one of the plurality of physical uplink shared channel segments may span across multiple slots.

In accordance with one aspect, an example method may be provided comprising: determining whether a user equipment should use a first method to determine a starting position of at least one redundancy version of a transport block in a circular buffer or a second method to determine the starting position of the at least one redundancy version of the transport block in the circular buffer, wherein the second method may comprise determining the starting position of the at least one redundancy version based, at least partially, on one of: a position of another redundancy version of the transport block in the circular buffer, or a scaling factor; and transmitting an indication to determine the starting position of the at least one redundancy version based on at least one of the first method or the second method.

The second method may comprise setting the starting position of the at least one redundancy version to be the same as an ending position of the other redundancy version.

The second method may comprise determining a remainder of: a division of a starting position of the other redundancy version plus a length of the other redundancy version, and a size of the circular buffer.

The second method may comprise determining the starting position of the at least one redundancy version based, at least partially, on at least one scalar.

The second method may comprise determining a remainder of a division of: a starting position of the other redundancy version plus a size of the other redundancy version plus a scalar of the at least one scalar, and a size of the circular buffer.

The example method may further comprise: transmitting an indication of at least one of a first value or a second value, wherein the first value and the second value may be configured to indicate the scalar.

The transmitting of the indication of at least one of the first value or the second value may comprise transmitting at least one of: a radio resource control configuration of at least one of the first value or the second value, or a downlink control information including the indication.

The example method may further comprise: transmitting an indication of a vector, wherein the vector may comprise information for determining a number of scalars of the at least one scalar that is less than a number of redundancy versions of the at least one redundancy version, and wherein the determined number of the at least one scalar may be cycles across the redundancy versions of the at least one redundancy version.

The second method may comprise determining a remainder of a division of: the predetermined starting position multiplied by the scaling factor, and a size of the circular buffer.

The scaling factor may be configured to scale a predetermined starting position of the at least one redundancy version towards a beginning or an ending of a codeword.

The scaling factor may comprise a single scaling factor applicable to a plurality of redundancy versions.

The example method may further comprise: transmitting at least one of: a radio resource control configuration, a system information block configuration, or a downlink control information comprising an indication of the scaling factor.

The indication of the scaling factor may comprise an indication of one of a plurality of scaling factors.

The transmitting of the indication may comprise transmitting at least one of: a bitmap in scheduling downlink control information, an indication included in radio resource control signaling, an indication included in system information block, or an indication included in a downlink control information message.

At least one of the at least one redundancy version or the other redundancy version may be configured to carry at least one of a plurality of physical uplink shared channel segments used for the transport block over multiple segment transmission.

At least the one of the plurality of physical uplink shared channel segments may span across multiple slots.

In accordance with one example embodiment, an apparatus may comprise: circuitry configured to perform: determine whether a user equipment should use a first method to determine a starting position of at least one redundancy version of a transport block in a circular buffer or a second method to determine the starting position of the at least one redundancy version of the transport block in the circular buffer, wherein the second method may comprise determining the starting position of the at least one redundancy version based, at least partially, on one of: a position of another redundancy version of the transport block in the circular buffer, or a scaling factor; and transmit, from the apparatus, an indication to determine the starting position of the at least one redundancy version based on at least one of the first method or the second method.

In accordance with one example embodiment, an apparatus may comprise: processing circuitry; memory circuitry including computer program code, the memory circuitry and the computer program code configured to, with the processing circuitry, enable the apparatus to: determine whether a user equipment should use a first method to determine a starting position of at least one redundancy version of a transport block in a circular buffer or a second method to determine the starting position of the at least one redundancy version of the transport block in the circular buffer, wherein the second method may comprise determining the starting position of the at least one redundancy version based, at least partially, on one of: a position of another redundancy version of the transport block in the circular buffer, or a scaling factor; and transmit, from the apparatus, an indication to determine the starting position of the at least one redundancy version based on at least one of the first method or the second method.

In accordance with one example embodiment, an apparatus may comprise means for performing: determining whether a user equipment should use a first method to determine a starting position of at least one redundancy version of a transport block in a circular buffer or a second method to determine the starting position of the at least one redundancy version of the transport block in the circular buffer, wherein the second method may comprise determining the starting position of the at least one redundancy version based, at least partially, on one of: a position of another redundancy version of the transport block in the circular buffer, or a scaling factor; and transmitting an indication to determine the starting position of the at least one redundancy version based on at least one of the first method or the second method.

The second method may comprise setting the starting position of the at least one redundancy version to be the same as an ending position of the other redundancy version.

The second method may comprise determining a remainder of: a division of a starting position of the other redundancy version plus a length of the other redundancy version, and a size of the circular buffer.

The second method may comprise determining the starting position of the at least one redundancy version based, at least partially, on at least one scalar.

The second method may comprise determining a remainder of a division of: a starting position of the other redundancy version plus a size of the other redundancy version plus a scalar of the at least one scalar, and a size of the circular buffer.

The means may be further configured to perform: transmitting an indication of at least one of a first value or a second value, wherein the first value and the second value may be configured to indicate the scalar.

The means configured to perform transmitting the indication of at least one of the first value or the second value may comprise means configured to perform transmitting at least one of: a radio resource control configuration of at least one of the first value or the second value, or a downlink control information including the indication.

The means may be further configured to perform: transmitting an indication of a vector, wherein the vector may comprise information for determining a number of scalars of the at least one scalar that is less than a number of redundancy versions of the at least one redundancy version, and wherein the determined number of the at least one scalar may be cycles across the redundancy versions of the at least one redundancy version.

The second method may comprise determining a remainder of a division of: the predetermined starting position multiplied by the scaling factor, and a size of the circular buffer.

The scaling factor may be configured to scale a predetermined starting position of the at least one redundancy version towards a beginning or an ending of a codeword.

The scaling factor may comprise a single scaling factor applicable to a plurality of redundancy versions.

The means may be further configured to perform: transmitting at least one of: a radio resource control configuration, a system information block configuration, or a downlink control information comprising an indication of the scaling factor.

The indication of the scaling factor may comprise an indication of one of a plurality of scaling factors.

The means configured to perform transmitting of the indication may comprise means configured to perform transmitting at least one of: a bitmap in scheduling downlink control information, an indication included in radio resource control signaling, an indication included in system information block, or an indication included in a downlink control information message.

At least one of the at least one redundancy version or the other redundancy version may be configured to carry at least one of a plurality of physical uplink shared channel segments used for the transport block over multiple segment transmission.

At least the one of the plurality of physical uplink shared channel segments may span across multiple slots.

In accordance with one example embodiment, a non-transitory computer-readable medium comprising program instructions stored thereon which, when executed with at least one processor, cause the at least one processor to: determine whether a user equipment should use a first method to determine a starting position of at least one redundancy version of a transport block in a circular buffer or a second method to determine the starting position of the at least one redundancy version of the transport block in the circular buffer, wherein the second method may comprise determining the starting position of the at least one redundancy version based, at least partially, on one of: a position of another redundancy version of the transport block in the circular buffer, or a scaling factor; and transmit an indication to determine the starting position of the at least one redundancy version based on at least one of the first method or the second method.

The second method may comprise setting the starting position of the at least one redundancy version to be the same as an ending position of the other redundancy version.

The second method may comprise determining a remainder of: a division of a starting position of the other redundancy version plus a length of the other redundancy version, and a size of the circular buffer.

The second method may comprise determining the starting position of the at least one redundancy version based, at least partially, on at least one scalar.

The second method may comprise determining a remainder of a division of: a starting position of the other redundancy version plus a size of the other redundancy version plus a scalar of the at least one scalar, and a size of the circular buffer.

The example non-transitory computer-readable medium may be further configured to: transmit an indication of at least one of a first value or a second value, wherein the first value and the second value may be configured to indicate the scalar.

Transmitting the indication of at least one of the first value or the second value may comprise the example non-transitory computer-readable medium being further configured to: transmit at least one of: a radio resource control configuration of at least one of the first value or the second value, or a downlink control information including the indication.

The example non-transitory computer-readable medium may be further configured to: transmit an indication of a vector, wherein the vector may comprise information for determining a number of scalars of the at least one scalar that is less than a number of redundancy versions of the at least one redundancy version, and wherein the determined number of the at least one scalar may be cycles across the redundancy versions of the at least one redundancy version.

The second method may comprise determining a remainder of a division of: the predetermined starting position multiplied by the scaling factor, and a size of the circular buffer.

The scaling factor may be configured to scale a predetermined starting position of the at least one redundancy version towards a beginning or an ending of a codeword.

The scaling factor may comprise a single scaling factor applicable to a plurality of redundancy versions.

The example non-transitory computer-readable medium may be further configured to: transmit at least one of: a radio resource control configuration, a system information block configuration, or a downlink control information comprising an indication of the scaling factor.

The indication of the scaling factor may comprise an indication of one of a plurality of scaling factors.

Transmitting the indication may comprise the example non-transitory computer-readable medium being further configured to: transmit at least one of: a bitmap in scheduling downlink control information, an indication included in radio resource control signaling, an indication included in system information block, or an indication included in a downlink control information message.

At least one of the at least one redundancy version or the other redundancy version may be configured to carry at least one of a plurality of physical uplink shared channel segments used for the transport block over multiple segment transmission.

At least the one of the plurality of physical uplink shared channel segments may span across multiple slots.

In accordance with another example embodiment, a non-transitory program storage device readable by a machine may be provided, tangibly embodying a program of instructions executable by the machine for performing operations, the operations comprising: determining whether a user equipment should use a first method to determine a starting position of at least one redundancy version of a transport block in a circular buffer or a second method to determine the starting position of the at least one redundancy version of the transport block in the circular buffer, wherein the second method may comprise determining the starting position of the at least one redundancy version based, at least partially, on one of: a position of another redundancy version of the transport block in the circular buffer, or a scaling factor; and transmitting an indication to determine the starting position of the at least one redundancy version based on at least one of the first method or the second method.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modification and variances which fall within the scope of the appended claims.

What is claimed is:

1. An apparatus comprising:
   at least one processor; and
   at least one non-transitory memory and computer program code, wherein the at least one memory and the computer program code are configured to, with the at least one processor, cause the apparatus to perform:
      determining a starting position of a first redundancy version of encoded bits of a transport block in a circular buffer, wherein the encoded bits of the transport block are to be transmitted over multiple slots,
      wherein the determining includes determining a remainder of a division of a first value by a second value,
      wherein the first value is a sum of a value indicating a starting position of another redundancy version, a size of the another redundancy version, and a scalar,
      wherein the second value is a size of the circular buffer,
      wherein the starting position of the first redundancy version is indicated by the remainder; and
      transmitting the encoded bits of the transport block starting from the starting position of the first redundancy version indicated by the remainder.

2. The apparatus of claim 1, wherein the determining the starting position of the first redundancy version comprises the at least one memory and the computer program code being configured to, with the at least one processor, cause the apparatus to perform:
   setting the starting position of the first redundancy version to an ending position of the another redundancy version.

3. The apparatus of claim 1, wherein a number of redundancy versions of the encoded bits of the transport block is equal to a number of physical uplink shared channel segments used for the transport block over multiple segment transmission.

4. The apparatus of claim 1, wherein the at least one memory and the computer program code are further configured to, with the at least one processor, cause the apparatus to perform:
   determining a third value and a fourth value; and
   determining the scalar, wherein the determining the scalar comprises multiplying the third value by a closest integer number smaller than the size of the circular buffer divided by the fourth value.

5. The apparatus of claim 4, wherein determining the third value and the fourth value comprises the at least one memory and the computer program code being configured to, with the at least one processor, cause the apparatus to perform at least one of:
   receiving a radio resource control configuration of at least one of the third value or the fourth value,
   determining at least one of the third value or the fourth value based on a specification, or
   receiving an indication of at least one of the third value or the fourth value in a downlink control information field.

6. The apparatus of claim 1, wherein the at least one memory and the computer program code are further configured to, with the at least one processor, cause the apparatus to perform: determining the scalar based, at least partially, on an indication of a vector, wherein the vector comprises information for determining a number of scalars that is less than a number of redundancy versions of the encoded bits of the transport block, and wherein the number of scalars are cycles across the redundancy versions.

7. An apparatus comprising:
at least one processor; and
at least one non-transitory memory and computer program code, wherein the at least one memory and the computer program code are configured to, with the at least one processor, cause the apparatus to perform:
determining a starting position of a first redundancy version of encoded bits of a transport block in a circular buffer, wherein the encoded bits of the transport block are to be transmitted over multiple slots,
wherein the determining includes determining a remainder of a division of:
a first value by a size of the circular buffer,
wherein the first value is a product of a value indicating a predetermined starting position of the first redundancy version and a scaling factor of the first redundancy version,
wherein the starting position of the first redundancy version is indicated by the remainder; and
transmitting the encoded bits of the transport block starting from the starting position of the first redundancy version indicated by the remainder.

8. The apparatus of claim 7, wherein the scaling factor is configured to scale the predetermined starting position of the first redundancy version towards a beginning or an ending of a codeword.

9. The apparatus of claim 7, wherein the scaling factor comprises a single scaling factor applicable to a plurality of redundancy versions.

10. The apparatus of claim 7, wherein the at least one memory and the computer program code are further configured to, with the at least one processor, cause the apparatus to perform: determining the scaling factor based on a ratio between a number of bits conveyed per physical uplink shared channel segment in the circular buffer and one of:
a size of a gap between an ending position of a redundancy version previous to the first redundancy version and the predetermined starting position of the first redundancy version, the plurality of redundancy versions including the first redundancy version, or
a largest size of a gap between any two consecutive redundancy versions of a plurality of redundancy versions, the plurality of redundancy versions including the first redundancy version.

11. A method comprising:
determining a starting position of a first redundancy version of encoded bits of a transport block in a circular buffer, wherein the encoded bits of the transport block are to be transmitted over multiple slots,
wherein the determining includes determining a remainder of
a division of a first value by a second value, wherein the first value is a sum of at least a value indicating a starting position of another redundancy version and a size of the another redundancy version,
wherein the second value is a size of the circular buffer,
wherein the starting position of the first redundancy version is indicated by the remainder; and
transmitting the encoded bits of the transport block starting from the starting position of the first redundancy version indicated by the remainder.

12. The method of claim 11, wherein the determining of the starting position of the first redundancy version comprises:
setting the starting position of the first redundancy version to be an ending position of the another redundancy version.

13. The method of claim 11, wherein the sum is a sum of the value indicating the starting position of the another redundancy version, the size of the another redundancy version, and a scalar.

14. The method of claim 13, wherein a number of redundancy versions of the encoded bits of the transport block is equal to a number of physical uplink shared channel segments used for the transport block over multiple segment transmission.

15. A non-transitory computer-readable medium comprising program instructions stored thereon which, when executed with at least one processor, cause the at least one processor to perform operations comprising:
determining a starting position of a first redundancy version of encoded bits of a transport block in a circular buffer,
wherein the encoded bits of the transport block are to be transmitted over multiple slots, wherein the determining includes determining a remainder of a division of a first value by a second value, wherein the first value is a sum of a value indicating a starting position of another redundancy version, a size of the another redundancy version, and a scalar,
wherein the second value is a size of the circular buffer,
wherein the starting position of the first redundancy version is indicated by the remainder; and
transmitting the encoded bits of the transport block starting from the starting position of the first redundancy version indicated by the remainder.

* * * * *